US010361678B2

United States Patent
Iwaki et al.

(10) Patent No.: US 10,361,678 B2
(45) Date of Patent: Jul. 23, 2019

(54) ACOUSTIC WAVE RESONATOR, FILTER, AND DUPLEXER

(71) Applicant: TAIYO YUDEN CO., LTD., Tokyo (JP)

(72) Inventors: Masafumi Iwaki, Tokyo (JP); Yoshio Satoh, Tokyo (JP); Tabito Tanaka, Tokyo (JP); Hidetaro Nakazawa, Tokyo (JP); Takashi Matsuda, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 234 days.

(21) Appl. No.: 15/377,868

(22) Filed: Dec. 13, 2016

(65) Prior Publication Data

US 2017/0170808 A1    Jun. 15, 2017

(30) Foreign Application Priority Data

Dec. 14, 2015    (JP) .................................. 2015-243626
Oct. 31, 2016    (JP) .................................. 2016-213472

(51) Int. Cl.
*H03H 9/64* (2006.01)
*H03H 9/02* (2006.01)
(Continued)

(52) U.S. Cl.
CPC ...... *H03H 9/6489* (2013.01); *H03H 9/02889* (2013.01); *H03H 9/14532* (2013.01); *H03H 9/725* (2013.01)

(58) Field of Classification Search
CPC ............. H03H 9/6489; H03H 9/02622; H03H 9/02881; H03H 9/02889; H03H 9/14532; H03H 9/725
(Continued)

(56) References Cited

U.S. PATENT DOCUMENTS

2012/0313483 A1    12/2012    Matsuda et al.
2013/0051588 A1     2/2013    Ruile et al.
(Continued)

FOREIGN PATENT DOCUMENTS

JP    9-270667 A    10/1997
JP    2008-78883 A    4/2008
(Continued)

OTHER PUBLICATIONS

Omori et al., Suppression of Transverse Mode Responses in Ultra-Wideband SAW Resonators Fabricated on a Cu-Grating/15°YX-LiNbO3 Structure, Oct. 2007, IEEE Transactions on Ultrasonics, Ferroelectric, and Frequency Control, pp. 1943-1948.*
(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave resonator includes: a piezoelectric substrate; and an IDT located on the piezoelectric substrate and including a pair of comb-shaped electrodes facing each other, each of the pair of comb-shaped electrodes including a grating electrode exciting an acoustic wave and a bus bar to which the grating electrode is connected, wherein an anisotropy coefficient in a cross region where the grating electrodes of the pair of comb-shaped electrodes cross each other is positive; an anisotropy coefficient in a gap region located between a tip of the grating electrode of one of the pair of comb-shaped electrodes and the bus bar of the other is less than the anisotropy coefficient in the cross region, and an acoustic velocity of an acoustic wave propagating through the gap region is equal to or less than an acoustic velocity of an acoustic wave propagating through the cross region at an antiresonant frequency.

21 Claims, 32 Drawing Sheets

(51) Int. Cl.
*H03H 9/72* (2006.01)
*H03H 9/145* (2006.01)

(58) Field of Classification Search
USPC .......................................... 333/133, 193–196
See application file for complete search history.

(56) References Cited

U.S. PATENT DOCUMENTS

2014/0361850 A1    12/2014  Inoue et al.
2016/0072475 A1     3/2016  Mimura et al.

FOREIGN PATENT DOCUMENTS

| | | |
|---|---|---|
| JP | 2011-182096 A | 9/2011 |
| JP | 2013-106171 A | 5/2013 |
| JP | 2013-518455 A | 5/2013 |
| JP | 2014-239385 A | 12/2014 |
| JP | 2016-136712 A | 7/2016 |
| WO | 2014/192756 A1 | 12/2014 |

OTHER PUBLICATIONS

Japanese Office Action dated Apr. 3, 2018, in a counterpart Japanese patent application No. 2016-213472. (A machine translation (not reviewed for accuracy) attached.).

* cited by examiner

ACOUSTIC WAVE RESONATOR, FILTER, AND DUPLEXER

CROSS-REFERENCE TO RELATED APPLICATION

This application is based upon and claims the benefit of priorities of the prior Japanese Patent Application No. 2015-243626, filed on Dec. 14, 2015, and the prior Japanese Patent Application No. 2016-213472, filed on Oct. 31, 2016, the entire contents of which are incorporated herein by reference.

FIELD

A certain aspect of the present invention relates to an acoustic wave resonator, a filter, and a duplexer.

BACKGROUND

In high-frequency communication systems typified by mobile phones, used are high-frequency filters to remove unnecessary signals in frequency bands other than the frequency band used for communication. As the high-frequency filter, used is an acoustic wave resonator such as a surface acoustic wave (SAW) resonator. In the SAW resonator, a metal grating electrode is formed on a piezoelectric substrate such as a lithium tantalate ($LiTaO_3$) substrate or a lithium niobate ($LiNbO_3$) substrate.

The grating electrode excites a Shear Horizontal (SH) wave, a Rayleigh wave, or a boundary acoustic wave, which is a type of surface acoustic waves. Reflectors located at both sides in a direction in which acoustic waves excited by the grating electrode mainly propagate confines the acoustic waves to the grating electrode. Ladder-type filters and multi-mode filters can be formed with use of acoustic wave resonators. There has been known an acoustic wave resonator that weights a width of the grating electrode in a direction perpendicular to the propagation direction of the acoustic wave as disclosed in Japanese Patent Application Publication Nos. 9-270667 and 2008-78883.

In the acoustic wave resonator including the grating electrode, a lateral-mode spurious, which is unnecessary response, occurs. The lateral-mode spurious occurs when acoustic waves containing a component in a direction perpendicular to the propagation direction of the acoustic wave intensify each other at a certain wavelength. In Japanese Patent Application Publication Nos. 9-270667 and 2008-78883, the cross width differs depending on the position in the propagation direction of the acoustic wave, and thus the frequency at which the lateral-mode spurious occurs differs depending on the position in the propagation direction. Thus, the frequencies at which the acoustic waves in the lateral mode intensify each other are averaged, and the lateral-mode spurious is reduced. However, this does not mean that the generation of the acoustic wave in the lateral mode is inhibited. Thus, the acoustic wave in the lateral mode leaks to the outside of the grating electrode. Therefore, loss can be caused.

SUMMARY OF THE INVENTION

According to a first aspect of the present invention, there is provided an acoustic wave resonator including: a piezoelectric substrate; and an Interdigital Transducer (IDT) that is located on the piezoelectric substrate, and includes a pair of comb-shaped electrodes facing each other, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive; an anisotropy coefficient in a gap region is less than the anisotropy coefficient in the overlap region, the gap region being located between a tip of the grating electrode of one of the pair of comb-shaped electrodes and the bus bar of another one of the pair of comb-shaped electrodes, and an acoustic velocity of an acoustic wave propagating through the gap region is equal to or less than an acoustic velocity of an acoustic wave propagating through the overlap region at an antiresonant frequency.

According to a second aspect of the present invention, there is provided an acoustic wave resonator including: a piezoelectric substrate; and an IDT that is located on the piezoelectric substrate, and includes a pair of comb-shaped electrodes facing each other, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive; an anisotropy coefficient in a region that is in the bus bar and adjacent to a side, which is closer to the overlap region, of the bus bar is less than the anisotropy coefficient in the overlap region and an anisotropy coefficient in a gap region that is located between a tip of the grating electrode of one of the pair of comb-shaped electrodes and the bus bar of another one of the pair of comb-shaped electrodes, and an acoustic velocity of an acoustic wave propagating through the gap region and an acoustic velocity of an acoustic wave propagating through the region that is in the bus bar and adjacent to the side, which is closer to the overlap region, of the bus bar are less than an acoustic velocity of an acoustic wave propagating through the overlap region at an antiresonant frequency.

According to a third aspect of the present invention, there is provided an acoustic wave resonator including: a piezoelectric substrate; and an IDT that is located on the piezoelectric substrate, and includes a pair of comb-shaped electrodes, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive, an anisotropy coefficient in a gap region is less than the anisotropy coefficient in the overlap region, the gap region being located between a tip of the grating electrode of one of the pair of comb-shaped electrodes and the bus bar of another one of the pair of comb-shaped electrodes, an acoustic velocity of an acoustic wave propagating through the gap region is greater than an acoustic velocity of an acoustic wave propagating through a central region of the overlap region, the central region being a region other than an edge region adjacent to the gap region in the overlap region, and an acoustic velocity of an acoustic wave propagating through the edge region is less than the acoustic velocity of the acoustic wave propagating through the central region.

According to a fourth aspect of the present invention, there is provided a filter including: any one of the above acoustic wave resonators.

According to a fifth aspect of the present invention, there is provided a duplexer including: the above filter.

DETAILED DESCRIPTION

Figure 1A:
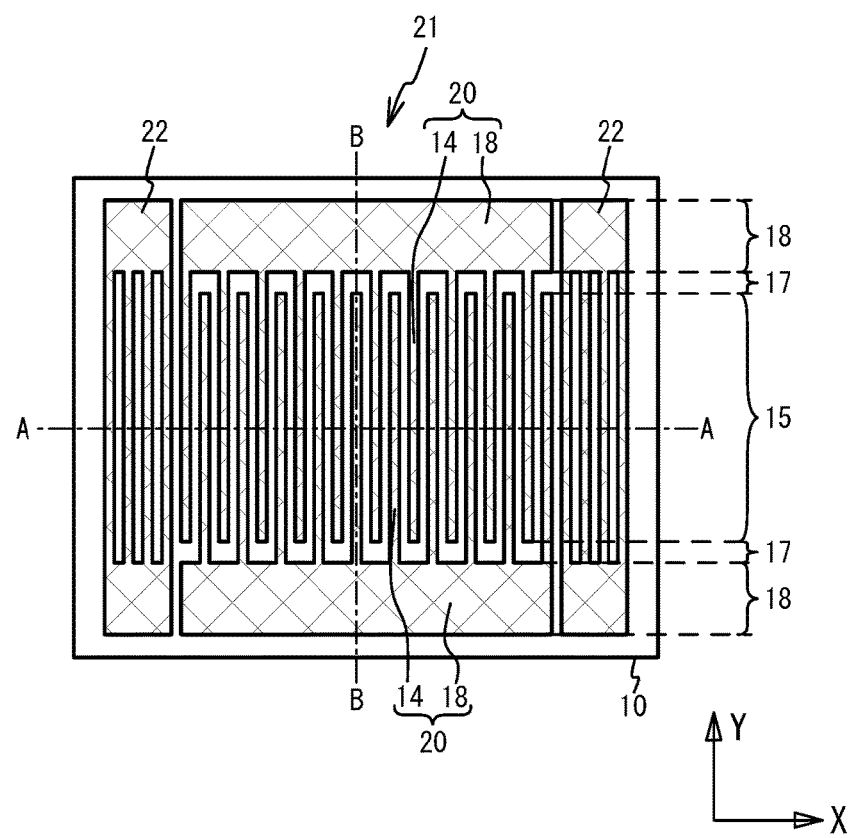
FIG. 1A is a plan view of an acoustic wave resonator in accordance with comparative examples and embodiments.
Figure 1B:
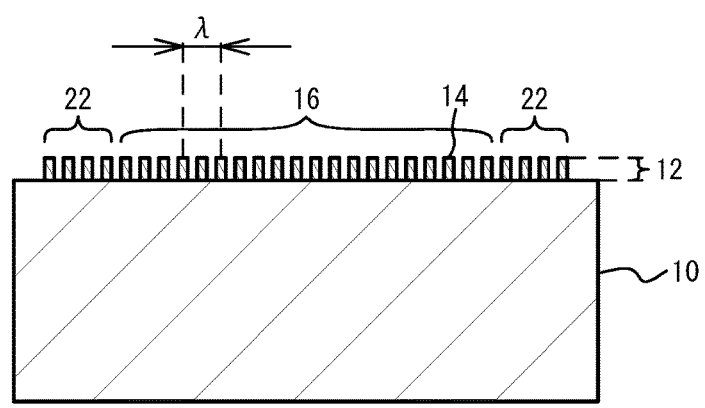
FIG. 1B is a cross-sectional view taken along line A-A in FIG. 1A.

The structure of an acoustic wave resonator in accordance with comparative examples and embodiments of the present invention will be described. FIG. 1A is a plan view of an acoustic wave resonator in accordance with comparative examples and embodiments, and FIG. 1B is a cross-sectional view taken along line A-A in FIG. 1A. As illustrated in FIG. 1A and FIG. 1B, an Interdigital Transducer (IDT) 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes electrode fingers 14 and a bus bar 18 to which the electrode fingers 14 are connected. The electrode fingers 14 form a grating electrode 16. The pair of comb-shaped electrodes 20 are located so as to face each other so that the electrode fingers 14 of one of the pair of comb-shaped electrodes 20 and the electrode fingers 14 of the other are arranged substantially in an alternate order.

A region in which the grating electrodes 16 of the pair of comb-shaped electrodes 20 overlap is an overlap region 15. An acoustic wave excited by the grating electrode 16 in the overlap region 15 propagates mainly in the array direction of the electrode fingers 14. The pitch of the grating electrode 16 is approximately equal to the wavelength $\lambda$, of the acoustic wave. A region between the tip of the metal grating electrode 16 of one of the comb-shaped electrodes 20 and the bus bar 18 of the other of the comb-shaped electrodes 20 is a gap region 17. When dummy electrode fingers are provided, the gap region is a region between the tip of the electrode finger and the tip of the dummy electrode finger. The propagation direction of the acoustic wave is defined as an X direction, and a direction perpendicular to the propagation direction is defined as a Y direction. The X direction and the Y direction do not always correspond to the X-axis direction and the Y-axis direction of the crystal orientation of the piezoelectric substrate 10. The piezoelectric substrate 10 is, for example, a lithium tantalate substrate or a lithium niobate substrate. The metal film 12 is, for example, an aluminum film or a copper film.

Figure 2A:
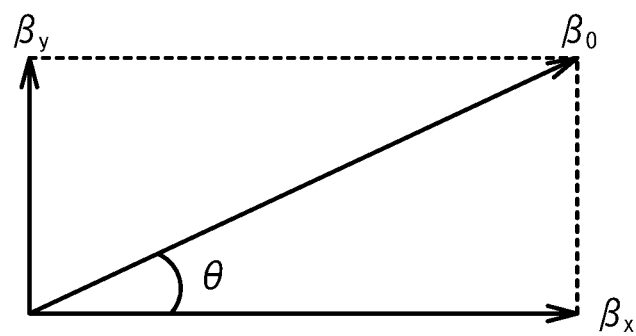
FIG. 2A is a plan view of a wave number in an X direction and a Y direction.
Figure 2B:
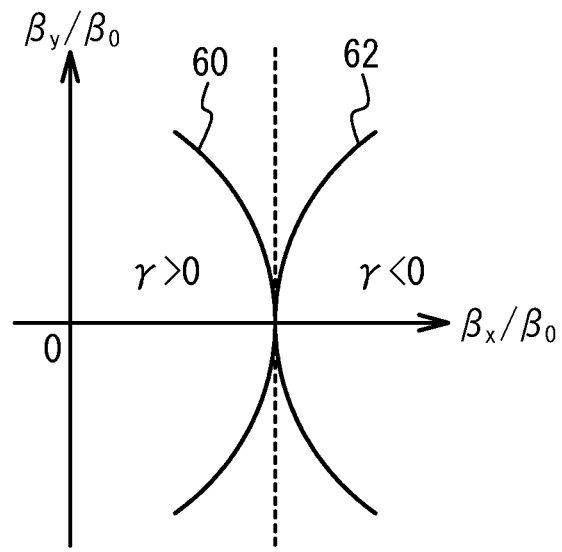
FIG. 2B illustrates $\beta_y/\beta_0$ with respect to $\beta_x/\beta_0$.

Next, an anisotropy coefficient will be described. FIG. 2A is a plan view of a wave number in the X direction and the Y direction, and FIG. 2B illustrates $\beta_x/\beta_0$ with respect to $\beta_y/(\beta_0$. As illustrated in FIG. 2A, the wave number in the X direction of the acoustic wave is represented by $\beta_x$, and the wave number in the Y direction of the acoustic wave is represented by $\beta_y$. When a wave number $\beta_\theta$ of the acoustic wave in the direction at an angle $\theta$ from the X direction to the Y direction is assumed to be approximated by a parabola with respect to the angle $\theta$, the wave number $\beta_\theta$ is expressed by $\beta_x^2 + \gamma \cdot \beta_y^2 = \beta_\theta^2$ with an anisotropy coefficient $\gamma$.

In FIG. 2B, $\beta_x/\beta_0$ corresponds to the slowness of the phase velocity of the acoustic wave in the X direction, and $\beta_y/\beta_0$ corresponds to the slowness of the phase velocity of the acoustic wave in the Y direction. When the anisotropy coefficient $\gamma$ is positive, a slowness surface 60 has a convex shape as viewed from the origin. Thus, the state of $\gamma>0$ is also called a convex state. When the anisotropy coefficient $\gamma$ is negative, a slowness surface 62 has a concave shape as viewed from the origin. Thus, the state of $\gamma<0$ is also called a concave state.

The anisotropy coefficient $\gamma$ is determined by the material of the piezoelectric substrate 10, and the material, the film thickness, and the pitch of the grating electrode 16. For example, when the piezoelectric substrate 10 is a rotated Y-cut X-propagation lithium niobate substrate, the anisotropy coefficient $\gamma$ is positive. When the piezoelectric substrate 10 is a rotated Y-cut X-propagation lithium tantalate substrate, the anisotropy coefficient $\gamma$ is negative. When a rotated Y-cut X-propagation lithium tantalate substrate is used, and the grating electrode 16 is made to be made of a heavy material and have a large film thickness, the anisotropy coefficient $\gamma$ may be positive.

First Comparative Example

Figure 3A:
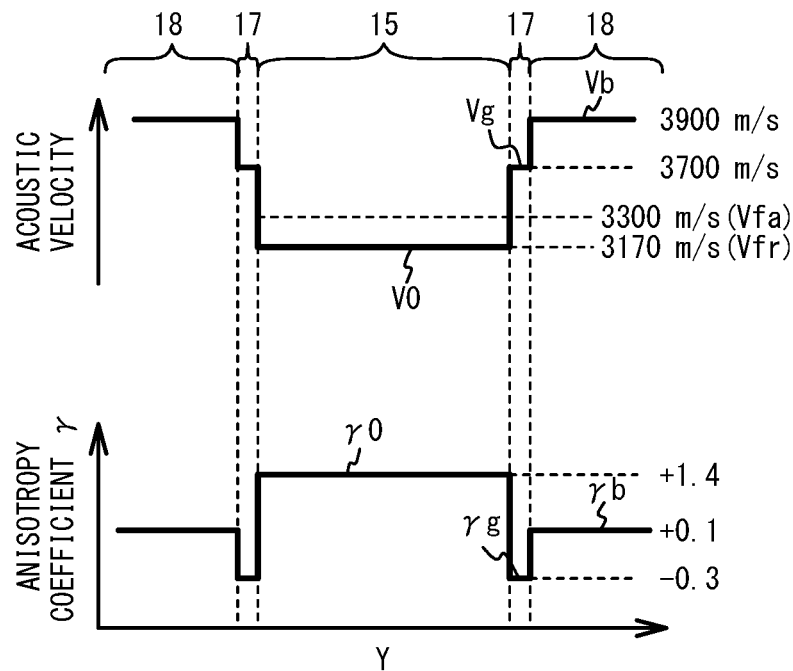
FIG. 3A illustrates an acoustic velocity and an anisotropy coefficient with respect to a position in the Y direction in an acoustic wave resonator in accordance with a first comparative example.

Next, a simulation of a first comparative example will be described. The cross-sectional view and the plan view of an acoustic wave resonator in accordance with the first comparative example are the same as those of FIG. 1A and FIG. 1B. FIG. 3A illustrates an acoustic velocity and an anisotropy coefficient with respect to a position in the Y direction in the acoustic wave resonator in accordance with the first comparative example.

For the simulation, the first comparative example was configured as follows.
Piezoelectric substrate: 42° rotated Y-cut X-propagation lithium tantalate substrate
Film thickness of the metal film 12: 0.1$\lambda$
Pitch $\lambda$: 4.4 μm
Duty ratio: 50%
Cross width: 20$\lambda$
Number of pairs: 100 pairs
Gap width: 0.5$\lambda$
Number of electrode fingers of the reflector: 10

The pitch $\lambda$ is the pitch of the grating electrode 16, and corresponds to the wavelength of the acoustic wave excited by the grating electrode 16. The duty ratio represents a ratio of the width of the grating electrode 16 to the pitch of the grating electrode 16. The overlap width represents the width of the overlap region 15 in the Y direction (the width along which the electrode fingers 14 overlap). The number of pairs is the number of pairs of the electrode fingers 14 in the grating electrode 16. The gap width represents the width of the gap region 17 in the Y direction. The number of the electrode fingers of the reflector represents the number of the electrode fingers of the reflector 22.

As illustrated in FIG. 3A, an acoustic velocity Vb in the bus bar 18 was configured to be 3900 m/s, an acoustic velocity Vg in the gap region 17 was configured to be 3700 m/s, and an acoustic velocity V0 in the overlap region 15 was configured to be 3170 m/s. The acoustic velocity V0 in the overlap region 15 corresponds to an acoustic velocity Vfr at a resonant frequency. The velocity 1.05 times greater than the acoustic velocity Vfr corresponds to an acoustic velocity Vfa at an antiresonant frequency, and is 3300 m/s. An anisotropy coefficient $\gamma$b in the bus bar 18 was configured to be +0.1, an anisotropy coefficient $\gamma$g in the gap region 17 was configured to be −0.3, and an anisotropy coefficient $\gamma$0 in the overlap region 15 was configured to be +1.4.

Figure 3B:
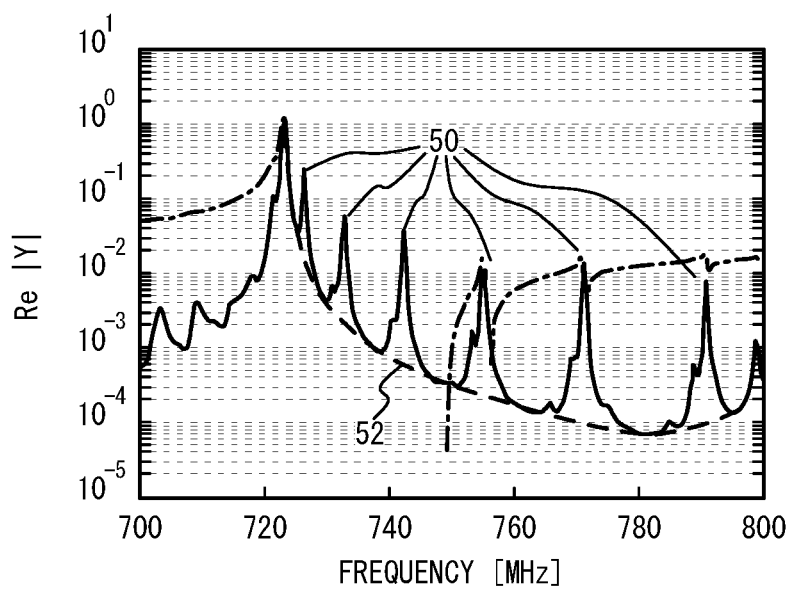
FIG. 3B is a graph of conductance versus frequency simulated for the acoustic wave resonator of the first comparative example.

FIG. 3B is a graph of conductance versus frequency simulated for the acoustic wave resonator of the first comparative example. In FIG. 3B, the solid line indicates the simulation result of a conductance Re|Y| of the acoustic wave resonator, the chain line indicates admittance, and the dashed line indicates a base level 52 of the conductance (i.e., the conductance when no lateral-mode spurious exist). The larger base level represents more leakage, from the overlap region to the bus bar 18, of the energy of the acoustic wave. The frequency at which the conductance is maximum is a resonant frequency. A plurality of lateral-mode spuriouses 50 occur at frequencies higher than the resonant frequency.

In the first comparative example, as illustrated in FIG. 3A, the acoustic velocity Vg in the gap region 17 is greater than the acoustic velocity V0 in the overlap region 15. Thus, acoustic waves containing a component in the Y direction as the propagation direction among acoustic waves excited by the overlap region 15 are reflected by the boundary between the overlap region 15 and the gap region 17. Accordingly, the energy of the acoustic wave is confined in the overlap region 15. However, the acoustic waves containing a component in the Y direction as the propagation direction cause unnecessary lateral-mode spurious 50.

Second Comparative Example

Figure 4A:
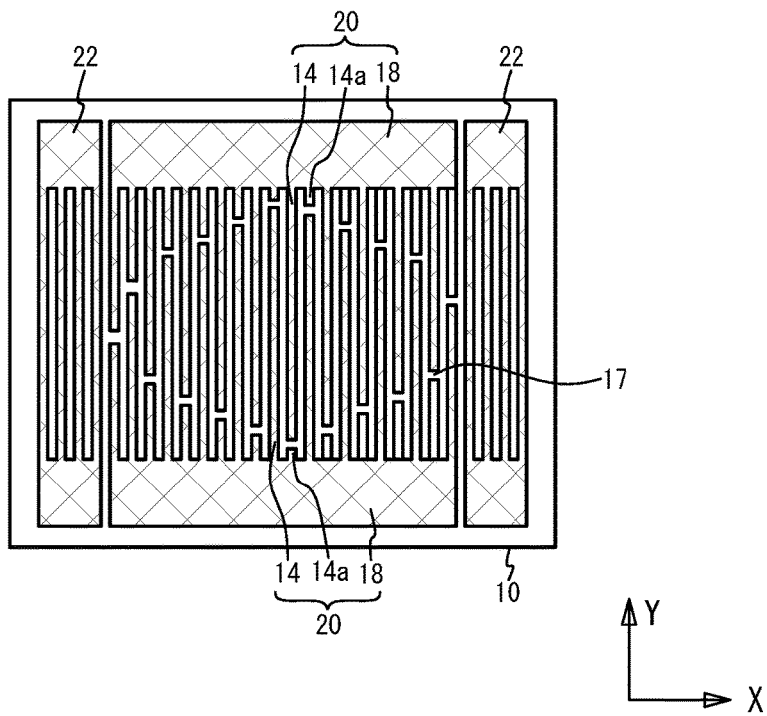
FIG. 4A is a plan view of an acoustic wave resonator in accordance with a second comparative example.

A simulation of a second comparative example will be described next. FIG. 4A is a plan view of an acoustic wave resonator in accordance with the second comparative example. The cross-sectional view is the same as FIG. 1B. As illustrated in FIG. 4A, the gap region 17 is formed between the electrode finger 14 of one of the comb-shaped electrodes 20 and a dummy electrode finger 14a of the other of the comb-shaped electrodes 20. The position of the gap region 17 is modulated in the X direction. This configuration modulates the overlap width in the X direction. In the second comparative example, the maximum overlap width was configured to be 30λ, and the overlap width was configured to change in accordance with arccos(X) in the X direction. Other simulation conditions are the same as those of the first comparative example.

Figure 4B:
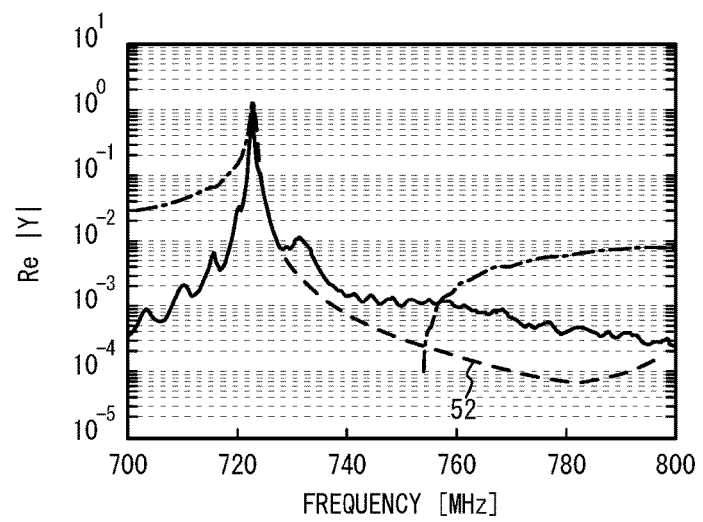
FIG. 4B is a graph of conductance versus frequency simulated for the acoustic wave resonator of the second comparative example.

FIG. 4B is a graph of conductance versus frequency simulated for the acoustic wave resonator of the second comparative example. In FIG. 4B, the lateral-mode spurious is hardly observed. The dashed line indicates the base level 52 of the first comparative example. The conductance is greater than the base level 52 of the first comparative example. In the second comparative example, the overlap width differs depending on the position in the X direction, and thus the frequency at which the lateral-mode spurious occurs differs depending on the position in the X direction. Thus, frequencies at which the acoustic waves propagating in the Y direction intensify each other are averaged, and the lateral-mode spurious 50 is thus reduced. However, this does not mean that the generation of the acoustic wave propagating in the Y direction is inhibited. Thus, the acoustic wave propagating in the Y direction leaks to the outside of the overlap region 15. Accordingly, the conductance becomes greater than the base level 52 of the first comparative example. Therefore, the loss increases.

First Embodiment

When the anisotropy coefficient γ is zero, the acoustic waves in the lateral mode propagating while containing a component in the Y direction does not exist in principle. Thus, the inventors thought of bringing the anisotropy coefficient γ in the gap region 17 close to zero. In the region where the anisotropy coefficient γ is near zero, a part of or the entire of the acoustic wave propagating in the Y direction does not satisfy the existence condition, and disappears. Thus, the anisotropy coefficient γ in the gap region 17 is brought close to zero. This configuration can reduce the lateral-mode spurious. Furthermore, the energy of the acoustic wave can be inhibited from leaking in the direction toward the bus bar. Therefore, the loss is reduced, and the Q-value increases.

Figure 5:
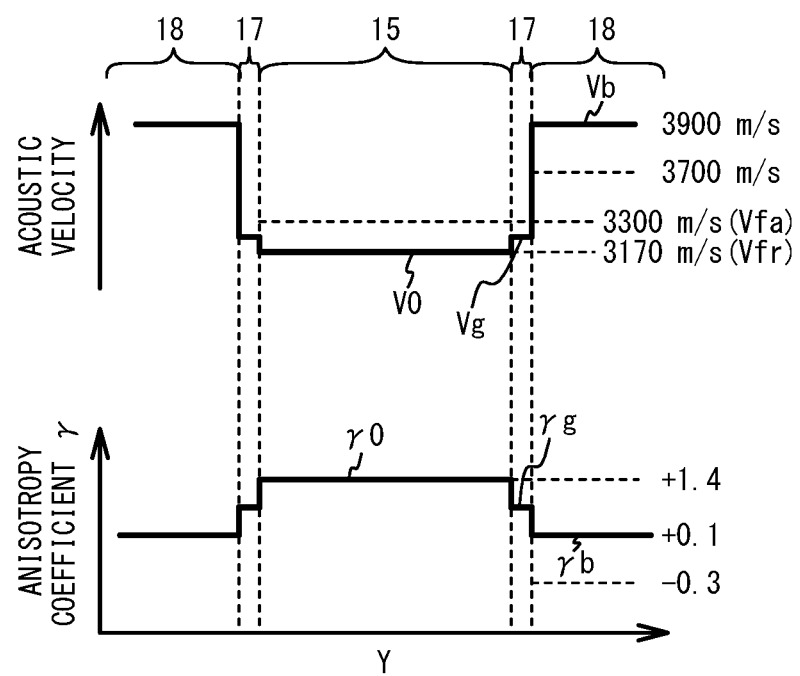
FIG. 5 illustrates an acoustic velocity and an anisotropy coefficient with respect to a position in the Y direction in an acoustic wave resonator in accordance with a first embodiment.
Figure 6A:
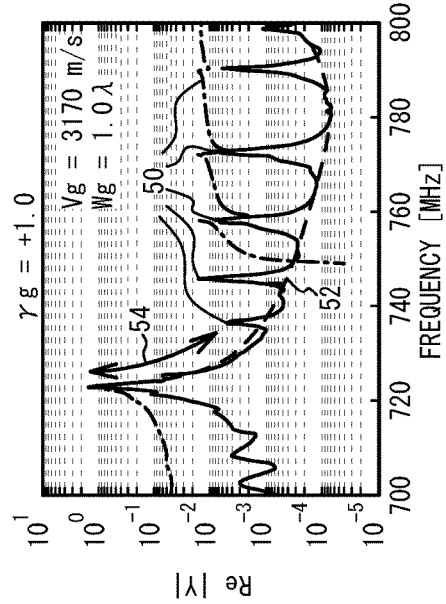
FIG. 6A through FIG. 6D are graphs (No. 1) of conductance versus frequency simulated for the acoustic wave resonator of the first embodiment.
Figure 6B:
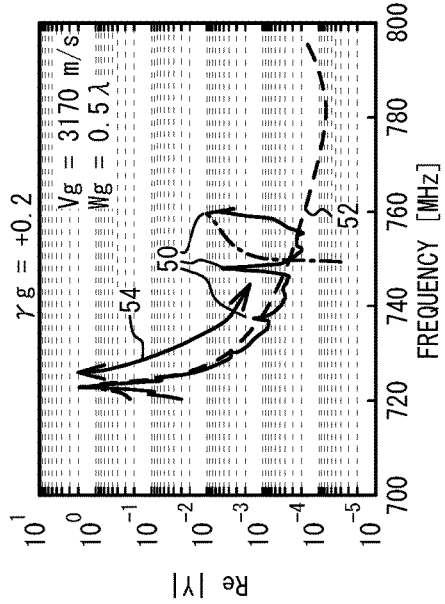
Figure 6C:
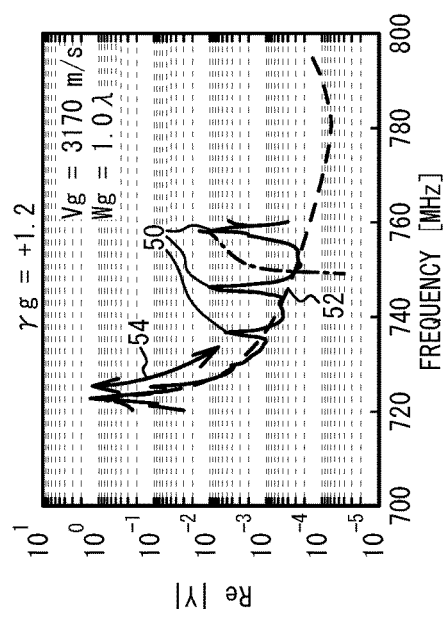
Figure 6D:
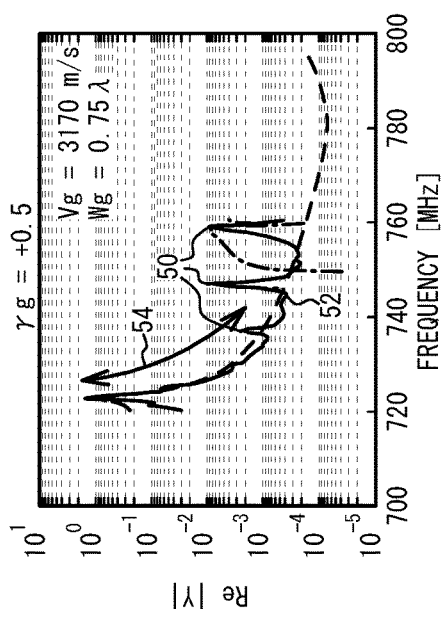

The plan view and the cross-sectional view of the acoustic wave resonator in accordance with the first embodiment are the same as those illustrated in FIG. 1A and FIG. 1B, and the description is thus omitted. The configuration used for the simulation is the same as that of the first comparative example. FIG. 5 illustrates an acoustic velocity and an anisotropy coefficient with respect to a position in the Y direction in the acoustic wave resonator in accordance with the first embodiment. As illustrated in FIG. 5, the acoustic velocity Vg in the gap region 17 is configured to be less than the acoustic velocity Vfa in the overlap region 15 at the antiresonant frequency. The anisotropy coefficient γg in the gap region 17 is configured to be less than the anisotropy coefficient γ0 in the overlap region 15. Other configurations are the same as those of the first comparative example illustrated in FIG. 3A.

FIG. 6A through FIG. 7C are graphs of conductance versus frequency simulated for the acoustic wave resonator of the first embodiment. The anisotropy coefficient γg in the gap region 17 was configured to be +1.2, +1.0, +0.5, +0.2, +0.0, −0.2, and −0.5. The acoustic velocity in the gap region 17 is adjusted to be within a range between the acoustic velocity Vfa in the overlap region 15 at the antiresonant frequency and the acoustic velocity Vfr in the overlap region 15 at the resonant frequency. A width Wg of the gap region 17 in the Y direction is adjusted.

As illustrated in FIG. 6A through FIG. 6D, as the anisotropy coefficient γg in the gap region 17 comes close to zero, a range 54 in which the generation of the lateral-mode spurious 50 is inhibited becomes larger. The base level of the conductance is approximately the same as the base level 52 of the first comparative example.

Figure 7A:
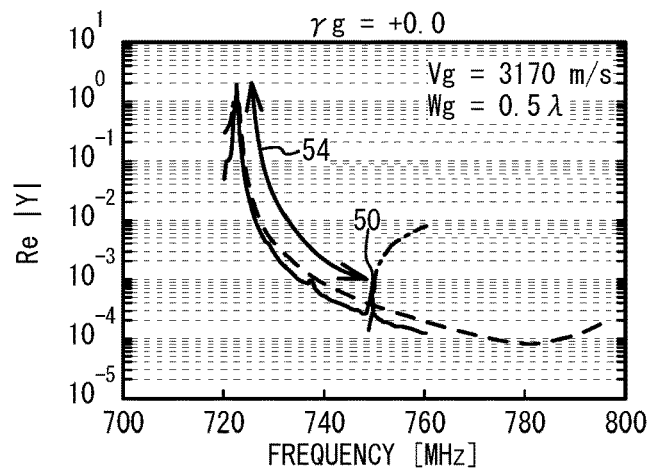
FIG. 7A through FIG. 7C are graphs (No. 2) of conductance versus frequency simulated for the acoustic wave resonator of the first embodiment.
Figure 7B:
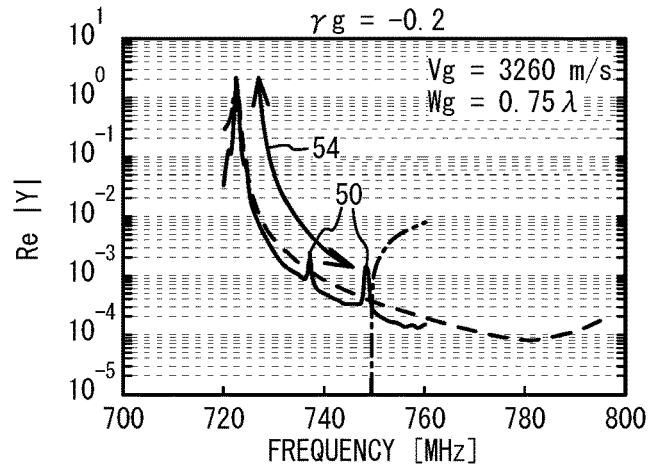
Figure 7C:
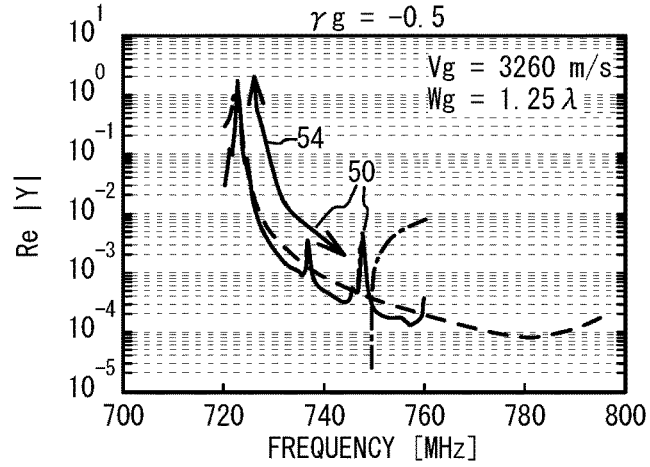

As illustrated in FIG. 7A, when the anisotropy coefficient γg in the gap region 17 is zero, the range 54 in which the generation of the lateral-mode spurious 50 is inhibited is further larger, and the generated lateral-mode spurious 50 is small. The base level of the conductance is equal to or less than approximately the base level 52 of the first comparative example. As illustrated in FIG. 7B and FIG. 7C, when the anisotropy coefficient γg in the gap region 17 is negative, the range 54 in which the generation of the lateral-mode spurious 50 is a little smaller, and the generated lateral-mode spurious 50 is large. As described above, when the anisotropy coefficient γg in the gap region 17 is brought close to zero, the acoustic wave in the lateral mode propagating in the Y-direction becomes diminished in the gap region 17. Thus, when the acoustic wave propagating in the Y direction passes through the gap region 17 from the overlap region 15, is reflected by the boundary between the gap region 17 and the bus bar 18, and then returns to the overlap region 15 through the gap region 17, the acoustic wave propagating in the Y direction is attenuated in the gap region 17. Accordingly, the lateral-mode spurious is reduced. In addition, since the acoustic wave propagating in the Y direction is attenuated, the base level of the conductance is small, and the energy loss can be thus reduced.

The first embodiment configures the acoustic velocity Vg in the gap region 17 to be equal to or less than the acoustic velocity Vfa in the overlap region 15 at the antiresonant frequency. As a third comparative example, the simulation was conducted on a case where the acoustic velocity Vg in the gap region 17 was configured to be the same as that of the first comparative example.

Figure 8A:
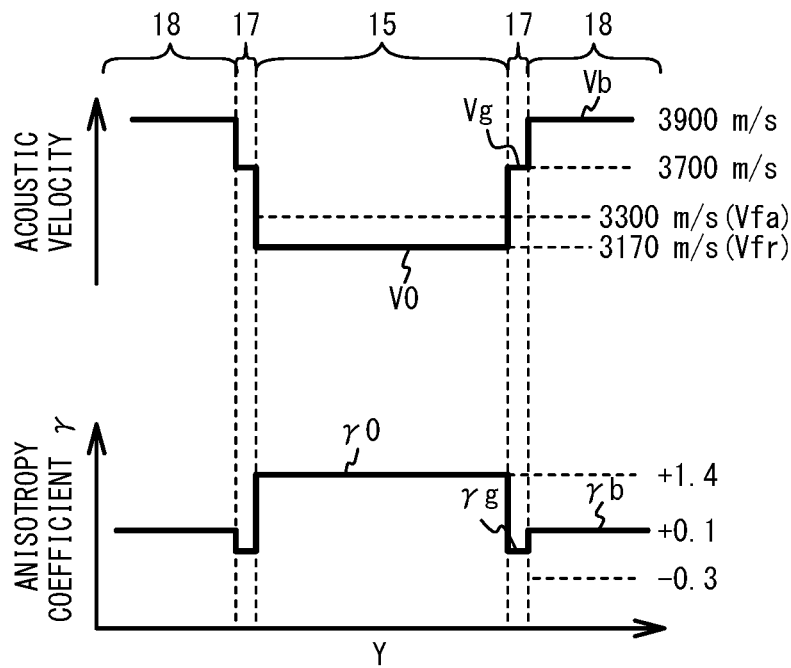
FIG. 8A illustrates an acoustic velocity and an anisotropy coefficient with respect to a position in the Y direction in an acoustic wave resonator in accordance with a third comparative example.

FIG. 8A illustrates an acoustic velocity and an anisotropy coefficient with respect to a position in the Y direction in an acoustic wave resonator in accordance with the third comparative example. As illustrated in FIG. 8A, the acoustic velocity Vg in the gap region 17 is 3700 m/s, which is the same as the acoustic velocity Vg in the gap region 17 of the first comparative example. The anisotropy coefficient γg in the gap region 17 is +0 as in the first embodiment illustrated in FIG. 7A. Other configurations are the same as those of the first embodiment.

Figure 8B:
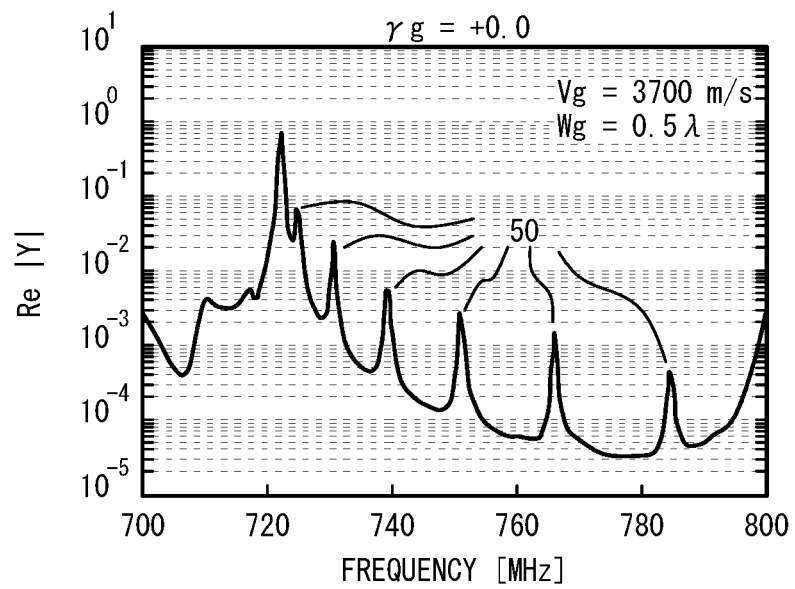
FIG. 8B is a graph of conductance versus frequency simulated for the acoustic wave resonator of the third comparative example.

FIG. 8B is a graph of conductance versus frequency simulated for the acoustic wave resonator of the third comparative example. As illustrated in FIG. 8B, the lateral-mode spuriouses 50 occur. This result reveals that to reduce the lateral-mode spurious, the acoustic velocity Vg in the gap region 17 is preferably configured to be equal to or less than the acoustic velocity Vfa at the antiresonant frequency. This is because when the acoustic velocity Vg is large, the acoustic wave propagating in the Y direction is reflected by the boundary face between the overlap region 15 and the gap region 17, and the acoustic wave propagating in the Y direction has difficulty in leaking from the overlap region 15 to the inside of the gap region 17. In this case, even though the anisotropy coefficient γg in the gap region 17 is brought close to zero, the acoustic wave propagating in the Y direction does not exist in the gap region 17, and the lateral-mode spurious cannot be thus reduced.

The first embodiment configures the anisotropy coefficient γg in the gap region 17 to be less than the anisotropy coefficient γ0 in the overlap region 15 when the anisotropy coefficient γ0 in the overlap region 15 is positive. Furthermore, the first embodiment configures the acoustic velocity Vg of the acoustic wave propagating through the gap region 17 to be equal to or less than the acoustic velocity Vfa of the acoustic wave propagating through the overlap region 15 at the antiresonant frequency. This configuration can reduce the lateral-mode spurious. In addition, the loss can be reduced. The anisotropy coefficient γg in a part of the gap region 17 may be less than the anisotropy coefficient γ0 in the overlap region 15 as long as the lateral-mode spurious can be reduced. In addition, the acoustic velocity Vg in a part of the gap region 17 may be equal to or less than the acoustic velocity Vfa as long as the lateral-mode spurious can be reduced.

The acoustic velocity Vg in the gap region 17 is preferably configured to be within a range that allows the acoustic wave containing a component in the Y direction as the propagation direction not to be reflected by the boundary between the overlap region 15 and the gap region 17. Even when the acoustic velocity Vg of the acoustic wave propagating through the gap region 17 is less than the acoustic velocity Vfr of the acoustic wave propagating through the overlap region 15 at the resonant frequency, the acoustic wave containing a component in the Y direction as the propagation direction is inhibited from being reflected by the boundary between the overlap region 15 and the gap region 17. However, to further inhibit the reflection of the acoustic wave, the acoustic velocity Vg of the acoustic wave propagating through the gap region 17 is preferably greater than the acoustic velocity Vfr of the acoustic wave propagating through the overlap region 15 at the resonant frequency.

As illustrated in FIG. 6A through FIG. 7C, the range 54 in which the lateral-mode spurious 50 can be reduced is wide especially when γg is within a range from +0.5 to −0.5. Furthermore, the range 54 further widens when γg is within a range from +0.2 to −0.2.

Thus, the anisotropy coefficient γg in the gap region 17 is preferably equal to or greater than −0.5 and equal to or less than +0.5, more preferably equal to or greater than −0.2 and equal to or less than +0.2. When γg is normalized by dividing γg by the anisotropy coefficient γ0 in the overlap region 15, γg/γ0 is preferably equal to or greater than −0.35 and equal to or less than +0.35, more preferably equal to or greater than −0.15 and equal to or less than +0.15.

Second Embodiment

Figure 9:
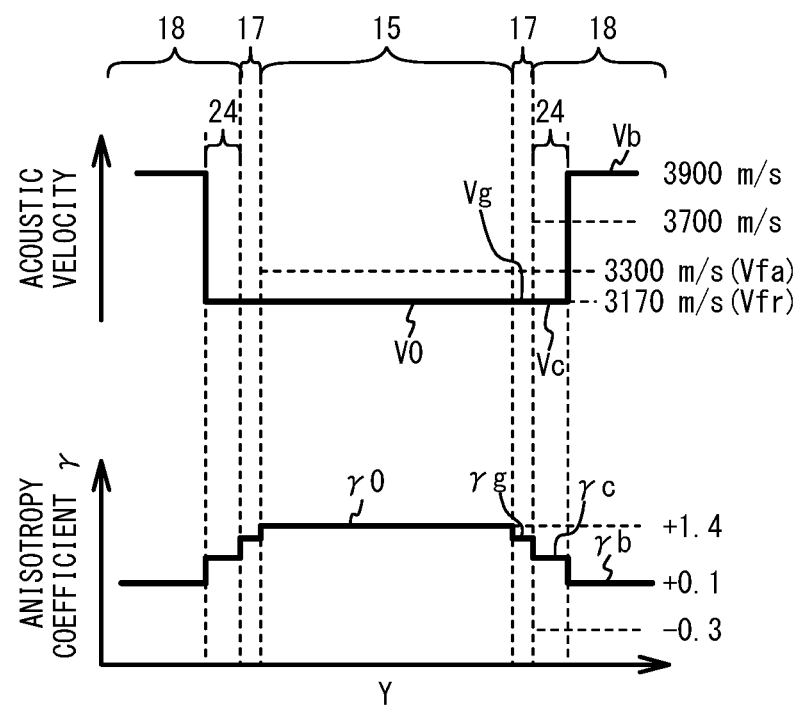
FIG. 9 illustrates an acoustic velocity and an anisotropy coefficient with respect to a position in the Y direction in an acoustic wave resonator in accordance with a second embodiment.

The plan view and the cross-sectional view of an acoustic wave resonator in accordance with a second embodiment are the same as those illustrated in FIG. 1A and FIG. 1B, respectively, and the description is omitted. FIG. 9 illustrates an acoustic velocity and an anisotropy coefficient with respect to a position in the Y direction in the acoustic wave resonator of the second embodiment. As illustrated in FIG. 9, the region 24 adjacent to the side that is one of the sides of the bus bar 18 and closer to the overlap region 15 is located in the bus bar 18. The acoustic velocity Vg in the gap region 17 and an acoustic velocity Vc in the region 24 are equal to or less than the acoustic velocity Vfa in the overlap region 15 at the antiresonant frequency. The acoustic velocity Vb in the region other than the region 24 in the bus bar 18 is the same as that of the first embodiment. An anisotropy coefficient γc in the region 24 is less than the anisotropy coefficient γ0 in the overlap region 15. The anisotropy coefficient γb in the region other than the region 24 in the bus bar 18 is the same as that of the first embodiment. Other configurations are the same as those of the first embodiment, and thus the description is omitted.

In the second embodiment, the acoustic velocity Vg of the acoustic wave propagating through the gap region 17 and the acoustic velocity Vc of the acoustic wave propagating through the region 24 are equal to or less than the acoustic velocity Vfa of the acoustic wave propagating through the overlap region 15 at the antiresonant frequency. This configuration inhibits the acoustic wave containing a component in the Y direction as the propagation direction from being reflected by the boundary between the overlap region 15 and the gap region 17 and the boundary between the gap region 17 and the region 24. Thus, the acoustic wave in the lateral mode leaks from the overlap region 15 to the region 24. The acoustic velocity Vg in a part of the gap region 17 and the acoustic velocity Vc in a part of the region 24 may be equal to or less than the acoustic velocity Vfa as long as the lateral-mode spurious can be reduced.

The anisotropy coefficient γc in the region 24 is less than the anisotropy coefficient γ0 in the overlap region 15 and the anisotropy coefficient γg in the gap region 17. As described above, when the anisotropy coefficient γc of the region 24 is brought close to zero, the acoustic wave in the lateral mode that propagates while containing a component in the Y direction can no more exist in the region 24. Thus, when the acoustic wave containing a component in the Y direction as the propagation direction passes through the gap region 17 and the region 24 from the overlap region 15, is reflected by the boundary between the region 24 and the region other than the region 24 in the bus bar 18, and returns to the overlap region 15 through the region 24 and the gap region 17, the acoustic wave containing a component in the Y direction as the propagation direction is attenuated in the region 24. Accordingly, the lateral-mode spurious can be reduced. In addition, since the acoustic wave containing a component in the Y direction as the propagation direction is attenuated, the base level of the conductance is small, and the energy loss can be reduced.

In the second embodiment, the acoustic wave containing a component in the Y direction as the propagation direction is attenuated in the region 24. Thus, the anisotropy coefficient γg in the gap region 17 may be greater than the anisotropy coefficient γ0 in the overlap region 15. However, the anisotropy coefficient γg in the gap region 17 is preferably equal to or less than the anisotropy coefficient γ0 in the overlap region 15. This configuration can attenuate the acoustic wave containing a component in the Y direction as the propagation direction also in the gap region 17.

The acoustic velocity Vg of the acoustic wave propagating through the gap region 17 and the acoustic velocity Vc of the acoustic wave propagating through the region 24 are preferably equal to or greater than the acoustic velocity Vfr of the acoustic wave propagating through the overlap region 15 at the resonant frequency. This configuration can further inhibit the acoustic wave containing a component in the Y direction as the propagation direction from being reflected by the boundary between the overlap region 15 and the gap region 17 and the boundary between the gap region 17 and the region 24.

As considered similar to FIG. 6A through FIG. 7C, the anisotropy coefficient γc in the region 24 is preferably equal to or greater than −0.5 and equal to or less than +0.5, more preferably equal to or greater than −0.2 and equal to or less than +0.2. When γc is normalized by dividing γc by the anisotropy coefficient γ0 in the overlap region 15, γc/γ0 is preferably equal to or greater than −0.35 and equal to or less than +0.35, more preferably equal to or greater than −0.15 and equal to or less than +0.15.

Third Embodiment

Figure 10A:
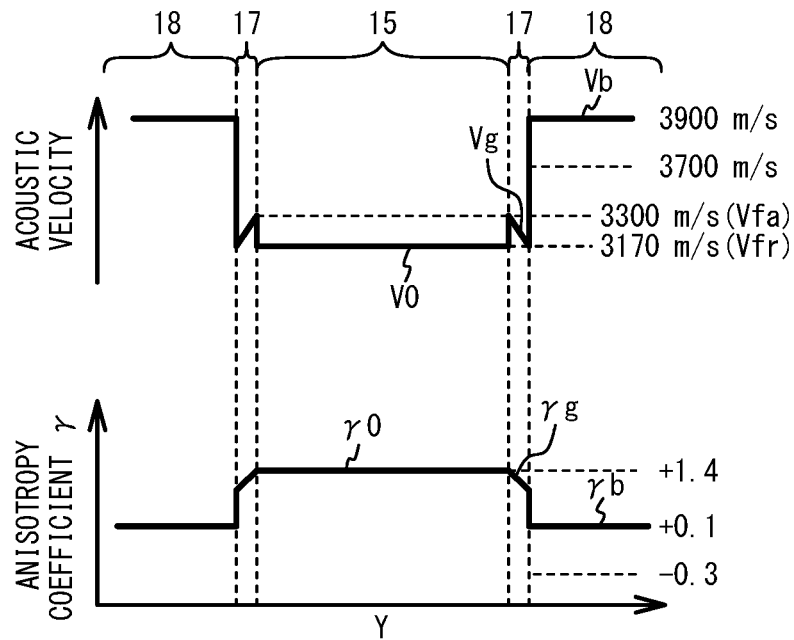
FIG. 10A and FIG. 10B illustrate an acoustic velocity and an anisotropy coefficient with respect to a position in the Y direction in acoustic wave resonators in accordance with a third embodiment and a first variation of the third embodiment, respectively.
Figure 10B:
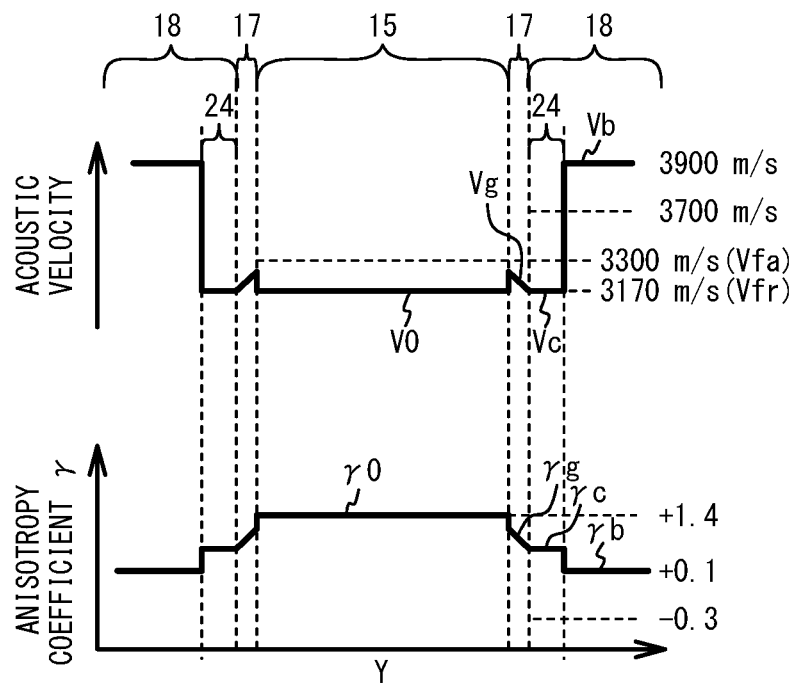

The plan view and the cross-sectional view of an acoustic wave resonator in accordance with a third embodiment are the same as those illustrated in FIG. 1A and FIG. 1B, respectively, and the description is omitted. FIG. 10A and FIG. 10B illustrate an acoustic velocity and an anisotropy coefficient with respect to a position in the Y direction in acoustic wave resonators in accordance with the third embodiment and a first variation of the third embodiment, respectively. As illustrated in FIG. 10A, the acoustic velocity Vg in the gap region 17 gradually decreases as the position from the overlap region 15 becomes closer to the bus bar 18. The anisotropy coefficient γg in the gap region 17 gradually decreases as the position from the overlap region 15 becomes closer to the bus bar 18. Other configurations are the same as those of the first embodiment, and thus the description is omitted.

As illustrated in FIG. 10B, the acoustic velocity Vg in the gap region 17 gradually decreases as the position from the overlap region 15 becomes closer to the bus bar 18. The anisotropy coefficient γg in the gap region 17 gradually decreases as the position from the overlap region 15 becomes closer to the bus bar 18. Other configurations are the same as those of the second embodiment, and the description is omitted.

The third embodiment and the variation thereof gradually decrease the anisotropy coefficient γg in the gap region 17 as the position from the overlap region 15 becomes closer to the bus bar 18. This configuration moderates the change in physical property in the gap region 17. Thus, the reflection of the acoustic wave propagating in the Y direction in the gap region 17 can be further inhibited. Therefore, the lateral-mode spurious and the loss can be further reduced.

Fourth Embodiment

Figure 11A:
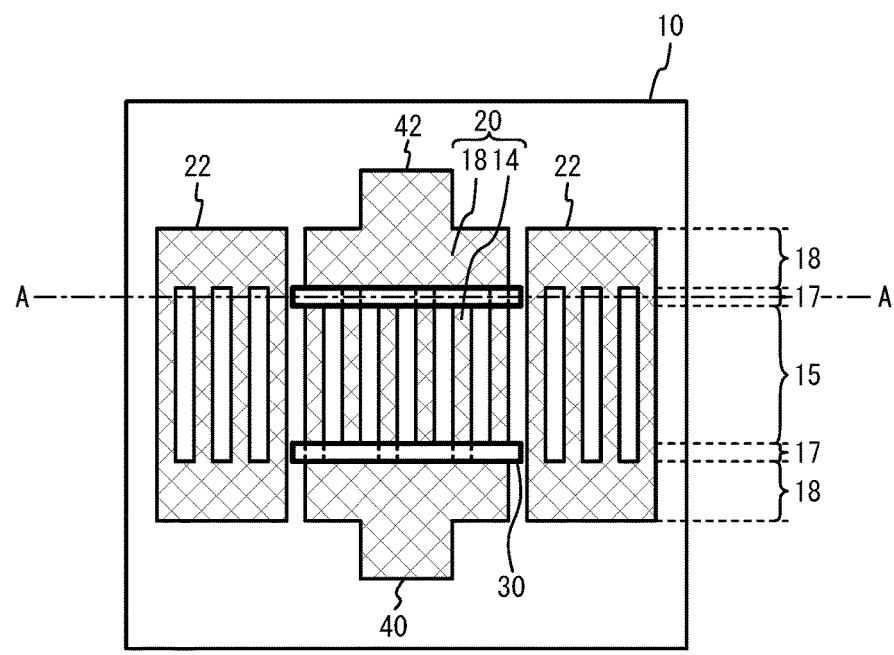
FIG. 11A is a plan view of an acoustic wave resonator in accordance with a fourth embodiment.
Figure 11B:
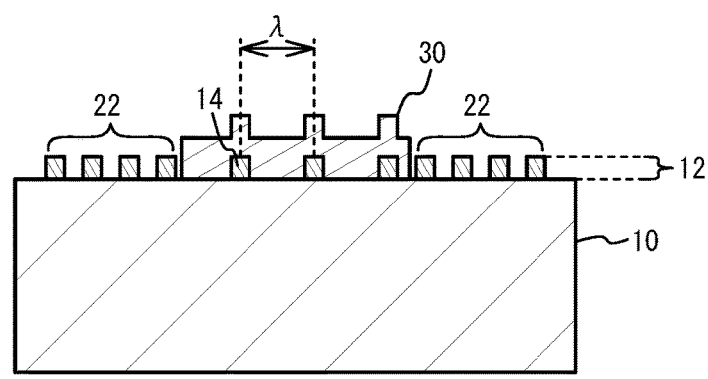
FIG. 11B is a cross-sectional view taken along line A-A in FIG. 11A, and is a cross-sectional view of a gap region.

A fourth embodiment is a specific example of the first embodiment. FIG. 11A is a plan view of an acoustic wave resonator in accordance with the fourth embodiment, FIG. 11B is a cross-sectional view taken along line A-A in FIG. 11A and is a cross-sectional view of the gap region. As illustrated in FIG. 11A and FIG. 11B, in the fourth embodiment, an additional film 30 made of a dielectric substance is located on the piezoelectric substrate 10 so as to cover the electrode fingers 14 in the gap region 17. An input terminal 40 and an output terminal 42 connecting to the bus bars 18 are provided. Other configurations are the same as those illustrated in FIG. 1A and FIG. 1B, and the description is omitted.

The dispersion curve of a lateral mode SH wave in the fourth embodiment was simulated. In the simulation, the additional film 30 was configured to be made of a tantalum oxide ($Ta_2O_5$) film with a film thickness of $0.1\lambda$. Other configurations used for the simulation are the same as those of the first embodiment.

Figure 12:
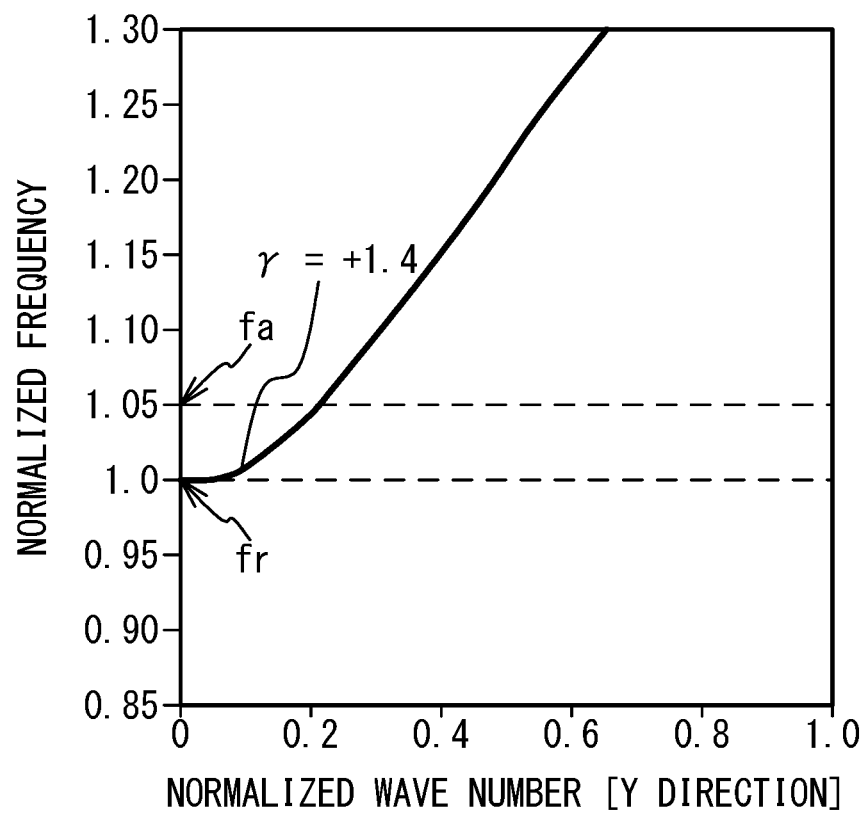
FIG. 12 illustrates a dispersion curve of an overlap region in the fourth embodiment.

FIG. 12 illustrates the dispersion curve of the overlap region in the fourth embodiment. In FIG. 12, the horizontal axis represents a normalized wave number in the Y direction. The normalized wave number is a wave number obtained by dividing a wave number in the Y direction by a wave number in the X direction at the resonant frequency of the overlap region 15. The vertical axis represents a normalized frequency obtained by dividing a frequency by the resonant frequency. In the dispersion curve, the frequency at which the wave number in the Y direction is zero corresponds to the resonant frequency fr in the overlap region 15, and corresponds to 1.0 of the normalized frequency. The dispersion curve represents a mode mainly used for the acoustic wave resonator among modes of the SH wave. The antiresonant frequency in the overlap region 15 is approximately 1.05 times greater than the resonant frequency. The normalized frequency of 1.05 corresponds to the antiresonant frequency fa. The anisotropy coefficient γ can be calculated based on the curvature of the dispersion curve. The anisotropy coefficient γg in the overlap region 15 is approximately 1.4.

Figure 13A:
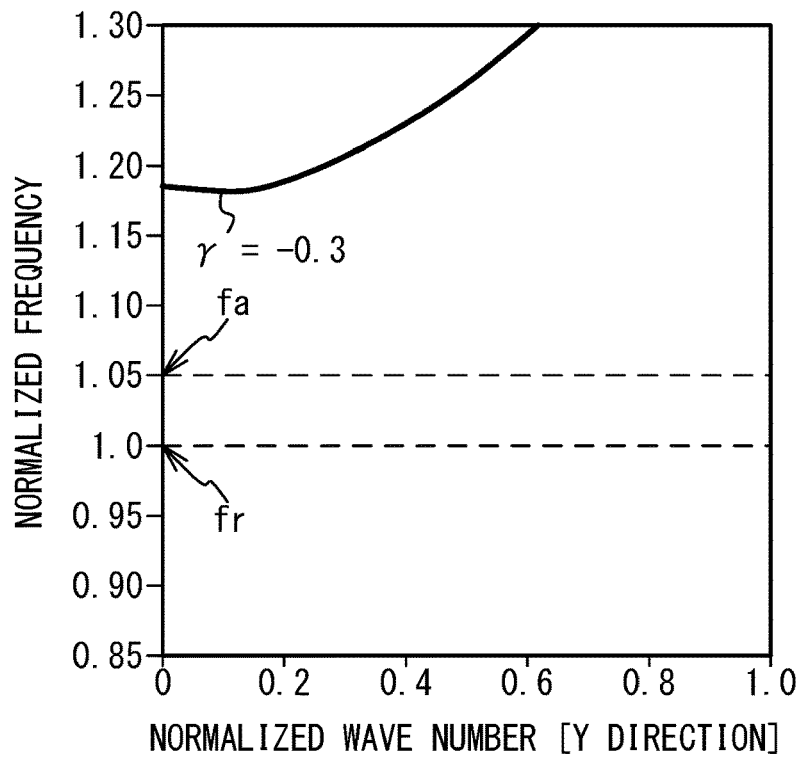
FIG. 13A and FIG. 13B illustrate dispersion curves of the gap region.
Figure 13B:
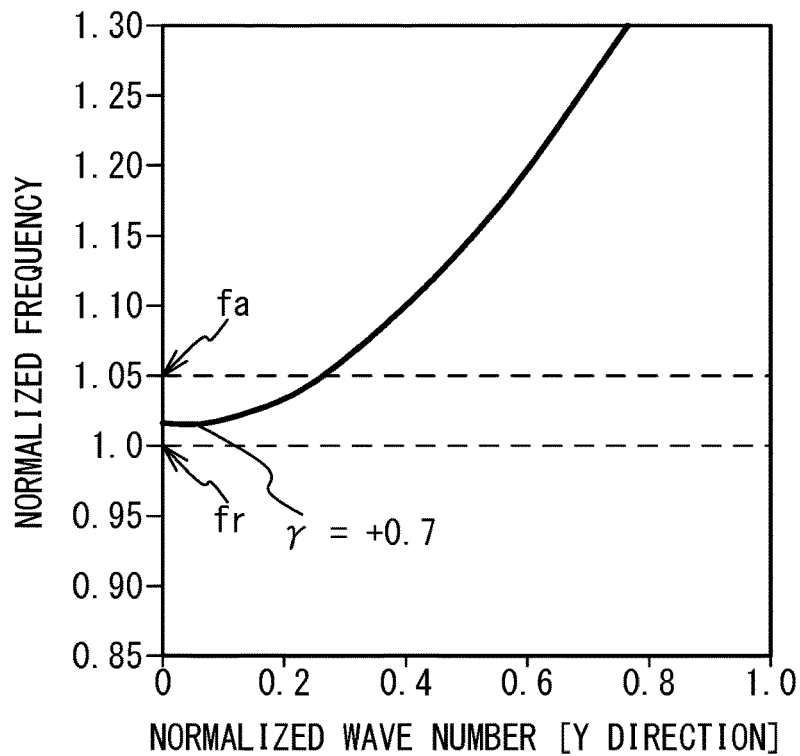

FIG. 13A and FIG. 13B illustrate dispersion curves of the gap region. FIG. 13A illustrates the dispersion carve when an additional film is not located in the gap region 17, and FIG. 13B illustrates the dispersion curve of the fourth embodiment that provides the additional film 30 in the gap region 17. As illustrated in FIG. 13A, when the additional film 30 is not located in the gap region 17, the normalized frequency when the wave number in the Y direction on the dispersion curve is zero (this means that the acoustic wave in the same mode as the acoustic wave in the overlap region 15 can propagate) is approximately 1.18. Since the acoustic velocity is proportionate to the normalized frequency, the acoustic velocity in the gap region 17 is 1.18 times greater than the acoustic velocity in the overlap region 15. Thus, the acoustic velocity in the gap region 17 is greater than the acoustic velocity Vfa in the overlap region 15 at the antiresonant frequency fa. This means that the acoustic wave is reflected by the boundary between the overlap region 15 and the gap region 17. Therefore, even when the anisotropy coefficient γg in the gap region 17 is −0.3, which is close to zero, the lateral-mode spurious occurs.

As illustrated in FIG. 13B, when the additional film 30 is located in the gap region 17, the normalized frequency when the wave number in the Y direction on the dispersion curve is zero is equal to or less than the antiresonant frequency fa and equal to or greater than the resonant frequency fr. The anisotropy coefficient γ is +0.7. Thus, the acoustic wave is not reflected by the boundary between the overlap region 15 and the gap region 17, and is attenuated when passing through the gap region 17. Therefore, the lateral-mode spurious can be reduced.

The fourth embodiment provides the additional film 30 on the piezoelectric substrate 10 in the gap region 17. This configuration allows the acoustic velocity Vg in the gap region 17 to be equal to or less than the acoustic velocity Vfa in the overlap region 15 at the antiresonant frequency, and allows the anisotropy coefficient γg in the gap region 17 to be less than the anisotropy coefficient γ0 in the overlap region 15. The material and the film thickness of the additional film 30 can be appropriately selected so that the acoustic velocity Vg and the anisotropy coefficient γg are within the above ranges. For example, the additional film 30 may be made of a dielectric substance, or may be made of other than the dielectric substance. The first embodiment may be achieved by a method other than the method described in the fourth embodiment.

Fifth Embodiment

Figure 14A:
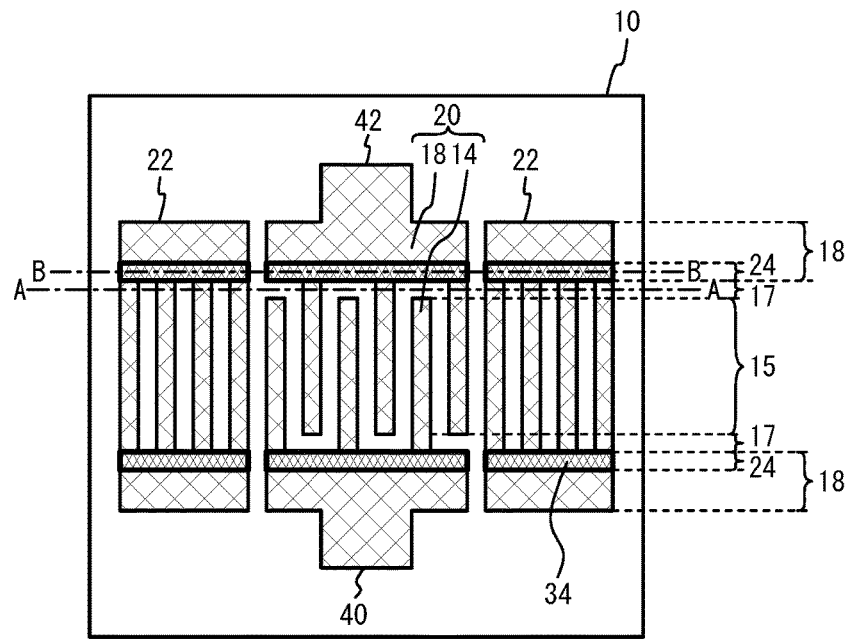
FIG. 14A is a plan view of an acoustic wave resonator in accordance with a fifth embodiment.
Figure 14B:
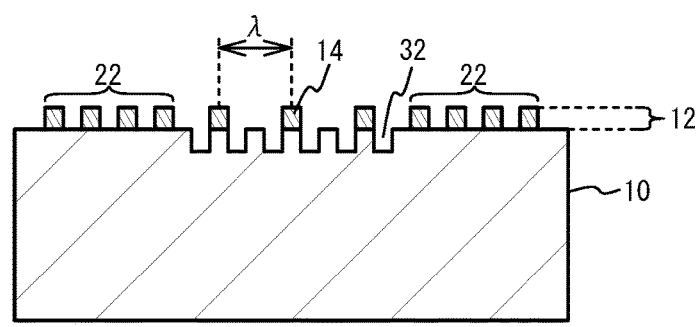
FIG. 14B is a cross-sectional view taken along line A-A in FIG. 14A and is a cross-sectional view of a gap region.
Figure 14C:
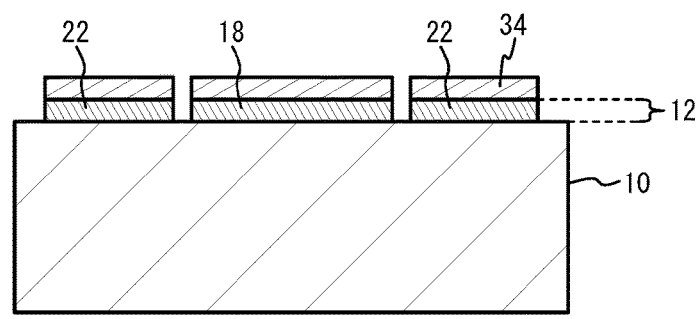
FIG. 14C is a cross-sectional view taken along line B-B in FIG. 14A and is a cross-sectional view of a region 24.

A fifth embodiment is a specific example of the second embodiment. FIG. 14A is a plan view of an acoustic wave resonator in accordance with the fifth embodiment, FIG. 14B is a cross-sectional view taken along line A-A in FIG. 14A and is a cross-sectional view of the gap region, and FIG. 14C is a cross-sectional view taken along line B-B in FIG. 14A and is a cross-sectional view of the region 24. As illustrated in FIG. 14A through FIG. 14C, in the fifth embodiment, a recessed portion 32 is formed on the upper surface of the piezoelectric substrate 10 between the electrode fingers 14 in the gap region 17. In the region 24, an additional film 34 is formed on the metal film 12. The input terminal 40 and the output terminal 42 connecting to the bus bars 18 are provided. Other configurations are the same as those illustrated in FIG. 1A and FIG. 1B, and thus the description is omitted.

The dispersion curve of the lateral mode SH wave of the fifth embodiment was simulated. In the simulation, the depth of the recessed portion 32 was configured to be $0.05\lambda$. The additional film 34 was configured to be formed of a Ti film with a film thickness of $0.05\lambda$ and a Au film with a film thickness of $0.04\lambda$ that are stacked in this order from the substrate 10 side. Other configurations used for the simulation are the same as those of the first embodiment.

Figure 15A:
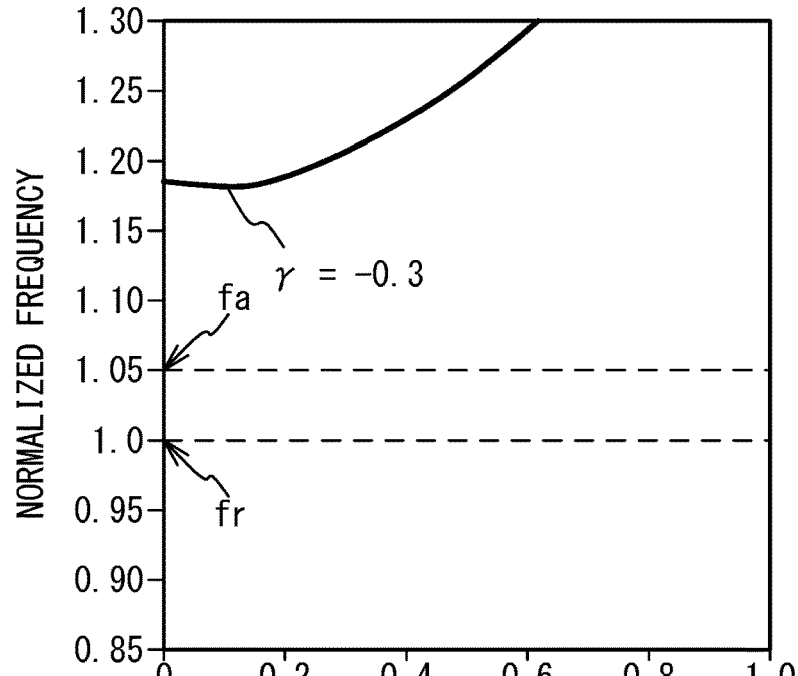
FIG. 15A and FIG. 15B illustrate dispersion curves of the gap region.
Figure 15B:
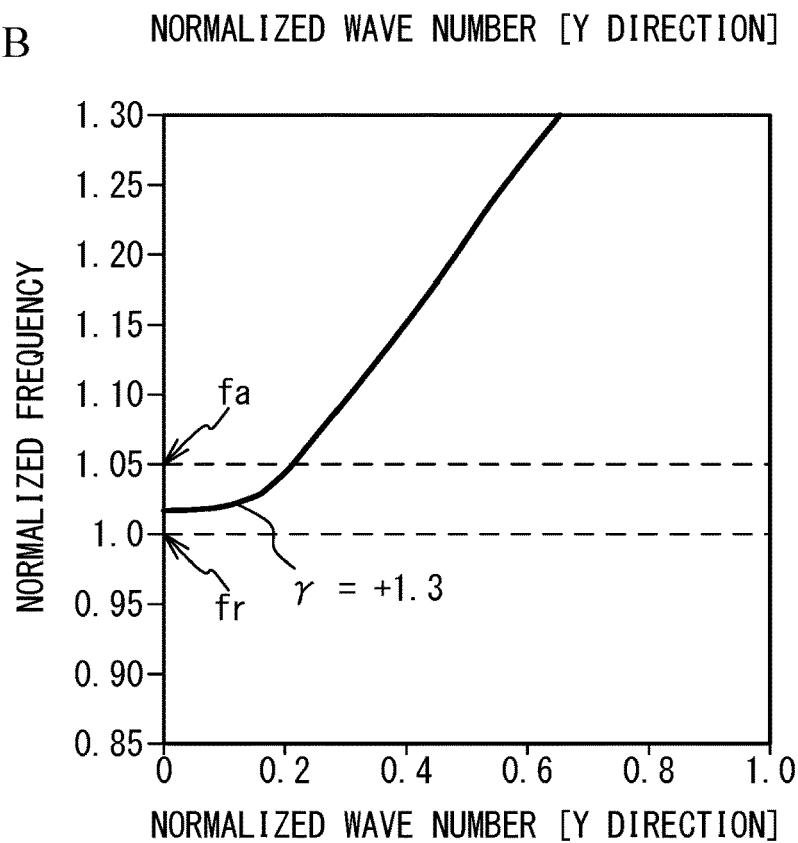

FIG. 15A and FIG. 15B illustrate dispersion curves in the gap region. FIG. 15A presents a case where a recessed portion is not located in the gap region 17 while FIG. 15B presents a case of the fifth embodiment that provides the recessed portion 32 in the gap region 17. As illustrated in FIG. 15A, the dispersion curve when the recessed portion 32 is not located in the gap region 17 is the same as the dispersion curve in FIG. 13A.

As illustrated in FIG. 15B, when the recessed portion 32 is located in the gap region 17, the normalized frequency when the wave number in the Y direction on the dispersion curve is zero is equal to or less than the antiresonant frequency fa and equal to or greater than the resonant frequency fr. The anisotropy coefficient $\gamma$ is +1.3. This means that the acoustic wave is not reflected by the boundary between the overlap region 15 and the gap region 17 and passes through the gap region 17.

Figure 16A:
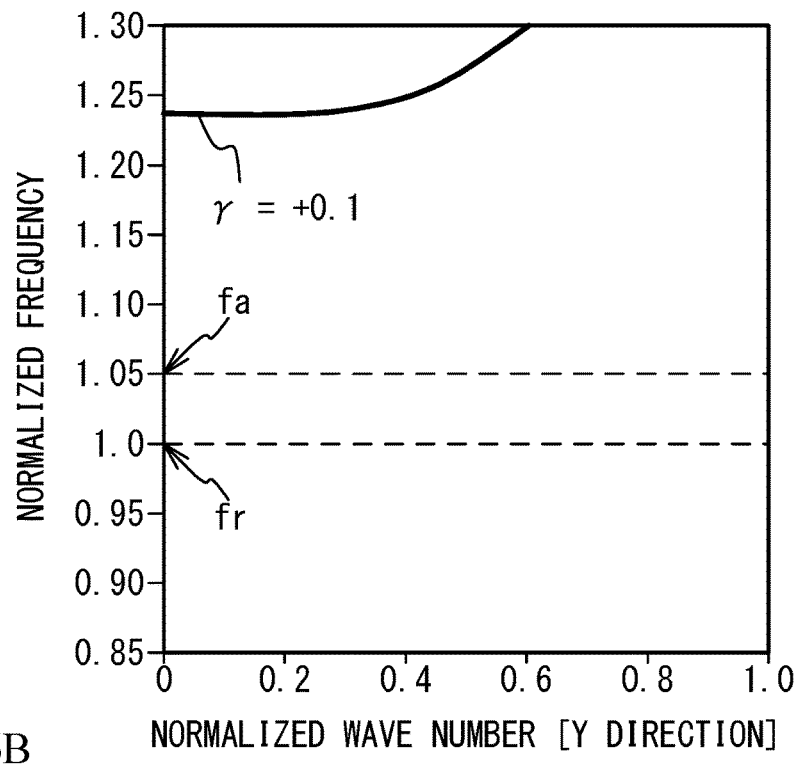
FIG. 16A and FIG. 16B illustrate dispersion curves of a bus bar.
Figure 16B:
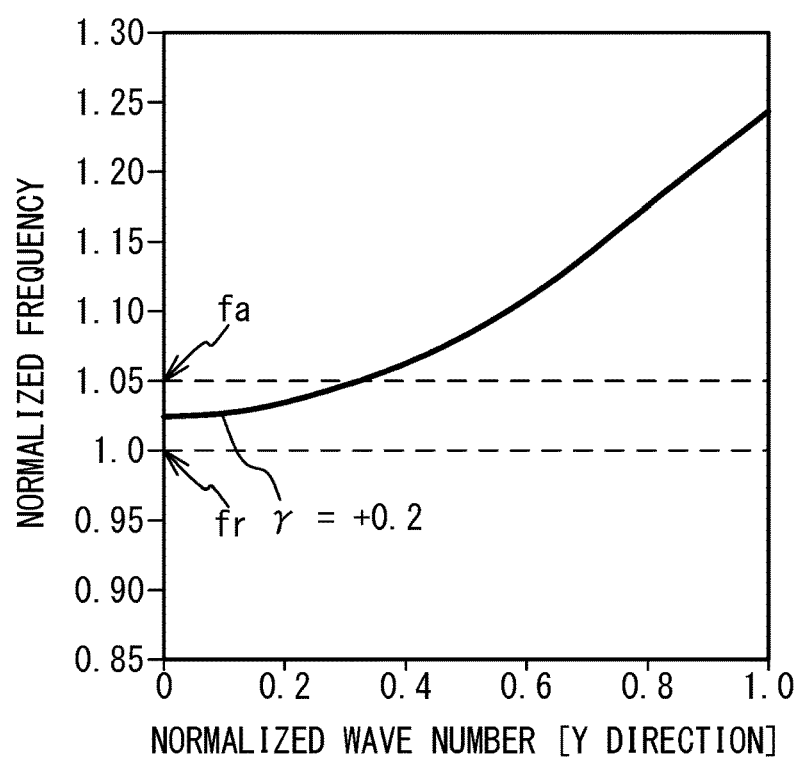

FIG. 16A and FIG. 16B illustrate dispersion curves of the bus bar. FIG. 16A presents a case where the additional film 34 is not located in the bus bar 18 while FIG. 16B presents a case of the fifth embodiment that provides the additional film 34 in the bus bar 18. As illustrated in FIG. 16A, when the additional film 34 is not located in the bus bar 18, the normalized frequency when the wave number in the Y direction is zero is 1.24 times greater than the resonant frequency fr. Thus, the acoustic velocity in the bus bar 18 is 1.25 times greater than the acoustic velocity in the overlap region 15. This means that the acoustic wave is reflected by the boundary between the gap region 17 and the bus bar 18.

As illustrated in FIG. 16B, when the additional film 34 is located in the bus bar 18, the normalized frequency when the wave number in the Y direction on the dispersion curve is zero is equal to or less than the antiresonant frequency fa and equal to or greater than the resonant frequency fr. The anisotropy coefficient $\gamma$ is +0.2. This means that the acoustic wave is not reflected by the boundary between the gap region 17 and the region 24, and is attenuated when passing through the region 24. Therefore, the lateral-mode spurious can be reduced.

The fifth embodiment provides the additional film 34 on the bus bar 18 in the region 24 adjacent to the side that is one of the sides of the bus bar 18 and closer to the grating electrode 16. The recessed portion 32 is located on the upper surface of the piezoelectric substrate 10 in the gap region 17. This configuration allows the acoustic velocities Vg and Vc in the gap region 17 and the region 24 to be equal to or less than the acoustic velocity Vfa in the overlap region 15 at the antiresonant frequency, and allows the anisotropy coefficient $\gamma c$ in the region 24 to be less than the anisotropy coefficient $\gamma 0$ in the overlap region 15 and the anisotropy coefficient $\gamma b$ in the gap region 17. The depth of the recessed portion 32 and the region where the recessed portion 32 is to be formed, the material and the film thickness of the additional film 34 can be appropriately selected so that the acoustic velocities Vg and Vc and the anisotropy coefficients $\gamma g$ and $\gamma c$ are within the above ranges. For example, the additional film 30 may be a metal film or an insulating film. The second embodiment may be achieved by a method other than the method described in the fifth embodiment.

Figure 17A:
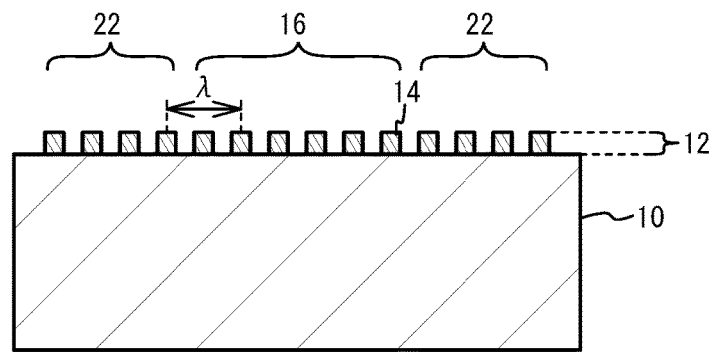
FIG. 17A through FIG. 17D are cross-sectional views of overlap regions of fourth and fifth embodiments.
Figure 17B:
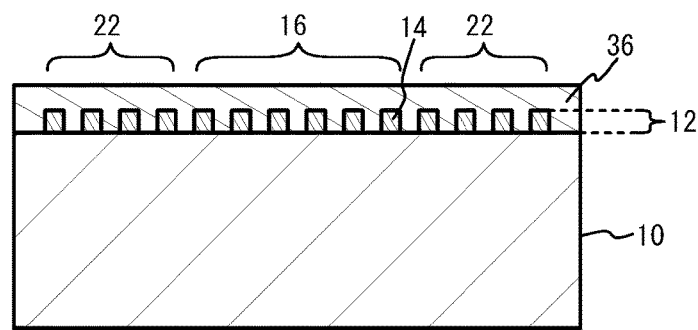
Figure 17C:
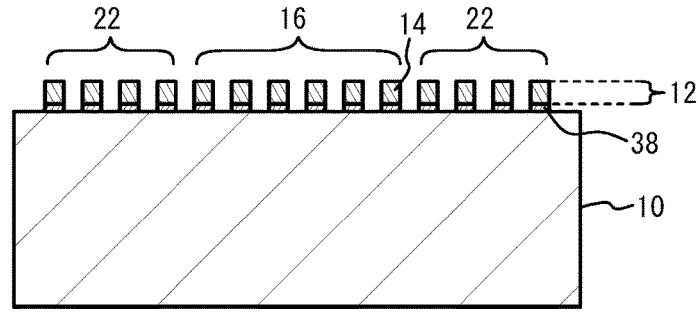
Figure 17D:
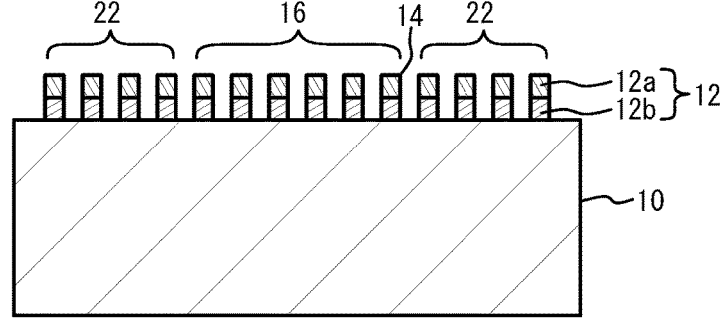

FIG. 17A through FIG. 17D are cross-sectional views of the overlap regions of the fourth and fifth embodiments. As illustrated in FIG. 17A, a film covering the grating electrode 16 may not be necessarily provided, and the metal film 12 may be a single-layer film. As illustrated in FIG. 17B, an insulating film 36 may be located on the piezoelectric substrate 10 so as to cover the grating electrode 16. The insulating film 36 is, for example, a film for adjusting the frequency, or a film for compensating the temperature characteristic of the frequency. As illustrated in FIG. 17C, an adhesion film 38 made of Ti, Cr, or the like may be formed between the metal film 12 and the piezoelectric substrate 10. As illustrated in FIG. 17D, the metal film 12 may be formed of different metal films $12a$ and $12b$ that are stacked.

When the acoustic velocity Vg in the gap region 17 is configured to be equal to or less than the acoustic velocity Vfa in the overlap region 15 at the antiresonant frequency as in the first through fourth embodiments, it becomes difficult to bring the anisotropy coefficient $\gamma g$ in the gap region 17 close to zero. In contrast, when the acoustic velocity Vg is configured to be equal to or less than the acoustic velocity Vfa in the overlap region 15 at the antiresonant frequency in the region 24 that is a part of the region of the bus bar 18 as in the second and fifth embodiments, the anisotropy coefficient $\gamma g$ in the gap region 17 can be relatively easily brought close to zero.

In the acoustic wave resonators of the first through fifth embodiments, the pitch of the grating electrode 16 and the electrode pitch in the reflector 22 may differ from each other by several percent. The pitch in the grating electrode 16 may be modulated by several percent. The piezoelectric substrate 10 may be, for example, a lithium niobate substrate or a lithium tantalate substrate. The piezoelectric substrate 10 may be formed on a support substrate such as a sapphire substrate.

Sixth Embodiment

Figure 18A:
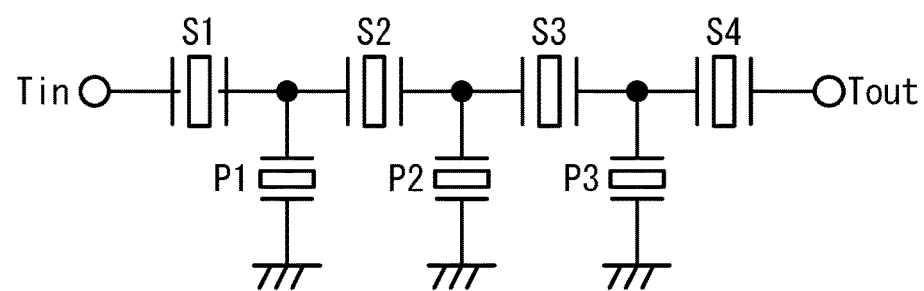
FIG. 18A is a circuit diagram of a filter in accordance with a sixth embodiment.

A sixth embodiment is an exemplary filter and an exemplary duplexer using the acoustic wave resonator according to any one of the first through fifth embodiments. FIG. 18A is a circuit diagram of a filter in accordance with the sixth embodiment. As illustrated in FIG. 18A, one or more series resonators S1 through S4 are connected in series between an input terminal Tin and an output terminal Tout. One or more parallel resonators P1 through P3 are connected in parallel between the input terminal Tin and the output terminal Tout. At least one of one or more series resonators S1 through S4 and one or more parallel resonators P1 through P3 may be the acoustic wave resonator of any one of the first through fifth embodiments. A filter including the acoustic wave resonator of any one of the first through fifth embodiments may be a multimode filter instead of a ladder-type filter.

Figure 18B:
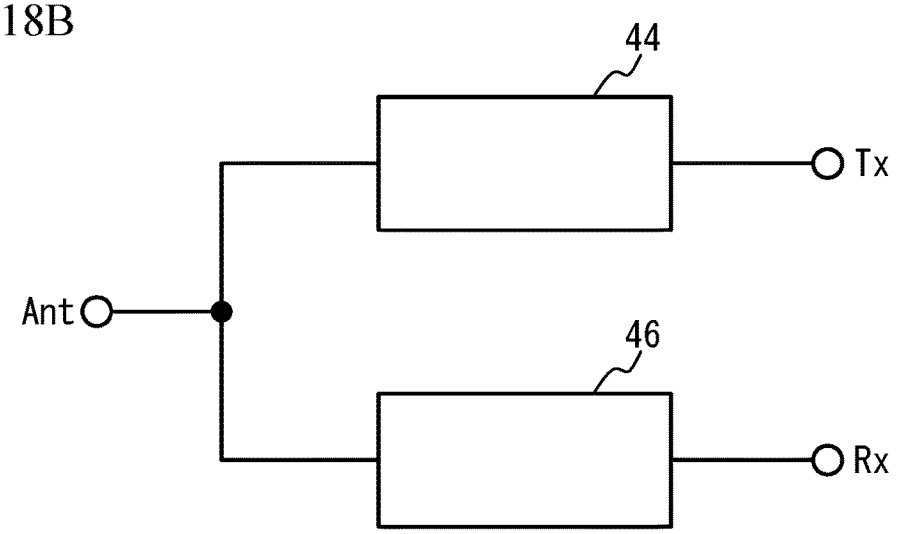
FIG. 18B is a circuit diagram of a duplexer in accordance with a variation of the sixth embodiment.

FIG. 18B is a circuit diagram of a duplexer in accordance with a variation of the sixth embodiment. As illustrated in FIG. 18B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 and the receive filter 46 may be the filter of the sixth embodiment.

Seventh Embodiment

Figure 19:
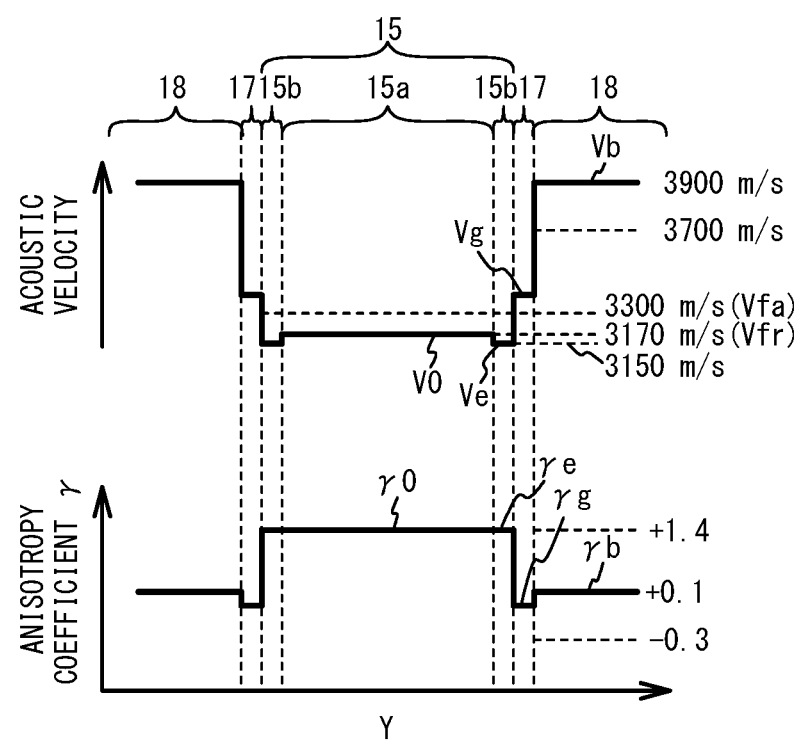
FIG. 19 illustrates an acoustic velocity and an anisotropy coefficient with respect to a position in the Y direction in an acoustic wave resonator in accordance with a seventh embodiment.

The plan view and the cross-sectional view of an acoustic wave resonator in accordance with a seventh embodiment are the same as those of FIG. 1A and FIG. 1B, and thus the description thereof is omitted. FIG. 19 illustrates acoustic velocity and anisotropy coefficient with respect to a position in the Y direction in the acoustic wave resonator of the seventh embodiment. As illustrated in FIG. 19, the overlap region 15 includes a central region 15a and edge regions 15b. The edge region 15b is a region adjacent to the gap region 17 in the overlap region 15, and the central region 15a is a region other than the edge regions 15b in the overlap region 15. An acoustic velocity Ve in the edge region 15b is less than the acoustic velocity V0 in the central region 15a. The acoustic velocity in the gap region 17 is greater than the the acoustic velocity in the central region 15a, and is less than the acoustic velocity in the bus bar 18. The anisotropy coefficient γ0 in the central region 15a is equal to an anisotropy coefficient γe in the edge region 15b. The anisotropy coefficient γg in the gap region 17 is less than the anisotropy coefficients γ0 and γe in the overlap region 15. Other configurations are the same as those of the first embodiment, and the description thereof is thus omitted.

In the first embodiment, as illustrated in FIG. 7A, even when the anisotropy coefficient γg in the gap region 17 is configured to be zero, small lateral-mode spurious 50 appears. The seventh embodiment can reduce the lateral-mode spurious 50 compared to the first embodiment. The principle will be described. As in the first embodiment, the anisotropy coefficient γg in the gap region 17 is configured to be closer to zero than the anisotropy coefficients γ0 and γe in the overlap region 15 are. In this configuration, a part of or the entire of the acoustic wave propagating in the Y direction does not satisfy the existence condition, and disappears. Therefore, as in the first embodiment, the lateral-mode spurious can be reduced.

When the anisotropy coefficient γ is positive, if the acoustic wave is to propagate from a region in which the acoustic velocity is small to a region in which the acoustic velocity is large, the acoustic wave is reflected, and attenuates. On the other hand, the acoustic wave can easily propagate from the region in which the acoustic velocity is large to the region in which the acoustic velocity is small. In the first embodiment, the acoustic velocity V0 in the overlap region 15 is less than the acoustic velocity Vg in the gap region 17. Thus, the propagating acoustic wave containing the Y-direction component leaking from the overlap region 15 into the gap region 17 returns to the overlap region 15 before disappearing. Accordingly, as illustrated in FIG. 7A, in the first embodiment, the lateral-mode spurious 50 remains.

In the seventh embodiment, the acoustic velocity Vg of the acoustic wave propagating through the gap region 17 is configured to be greater than the acoustic velocity V0 of the acoustic wave propagating through the central region 15a. This configuration confines the acoustic wave into the overlap region 15. Furthermore, the acoustic velocity Ve of the acoustic wave propagating through the edge region 15b is configured to be less than the acoustic velocity V0 of the acoustic wave propagating through the central region 15a. This configuration makes it difficult for the acoustic wave leaking from the overlap region 15 into the gap region 17 to propagate from the edge region 15b to the central region 15a. Accordingly, the propagating acoustic wave containing the Y direction component leaking from the overlap region 15 into the gap region 17 easily disappears in the gap region 17. Therefore, the lateral-mode spurious can be reduced.

When the acoustic velocity Vg of the acoustic wave propagating through the gap region 17 is configured to be greater than the acoustic velocity Vfa at the antiresonant frequency of the overlap region 15 as in the third comparative example, the acoustic wave has difficulty in leaking from the overlap region 15 to the gap region 17, and the lateral-mode spurious thus increases. Thus, in the first embodiment, the acoustic velocity at which the acoustic wave propagates in the gap region 17 is configured to be equal to or less than the acoustic velocity Vfa at the antiresonant frequency of the overlap region 15. However, methods for reducing the acoustic velocity in the gap region 17 are limited and difficult.

In the seventh embodiment, the acoustic velocity Vg in the gap region 17 may be greater than the acoustic velocity Vfa at the antiresonant frequency of the overlap region 15. This is because the acoustic wave in the lateral direction leaking from the overlap region 15 to the gap region 17 eventually disappears in the gap region 17 even if not returning from the edge region 15b to the central region 15a.

In the seventh embodiment, a simulation was conducted on an acoustic wave resonator with a decrease rate of the acoustic velocity in the edge region 15b, dVe=(Ve−V0)/V0× 100%, of −0.5%. The simulation was performed with a two-dimensional Coupling-Of-Modes (COM) equation, which is a COM equation used for obtaining the characteristics of the surface acoustic wave and extended to two dimensions. The same applies to the simulations of the first through fifth embodiments.

Figure 20A:
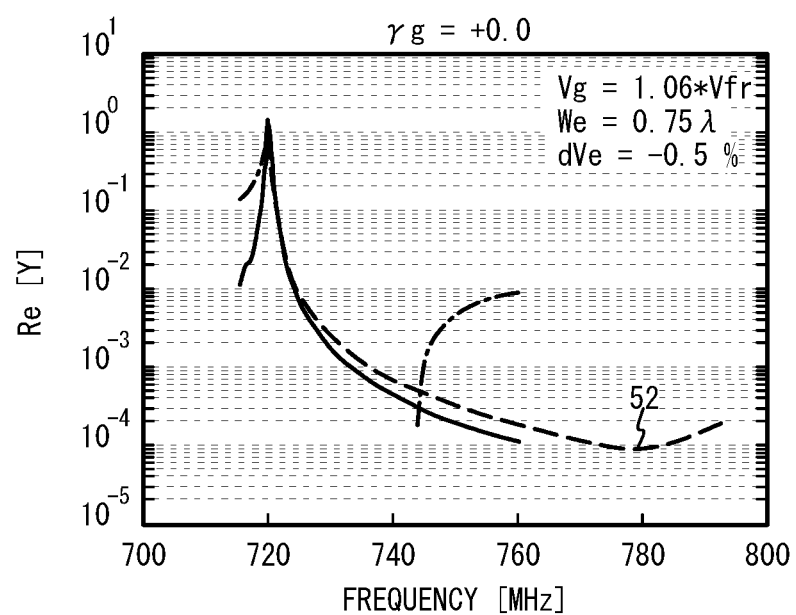
FIG. 20A and FIG. 20B are graphs of conductance versus frequency simulated for the acoustic wave resonator of the seventh embodiment.
Figure 20B:
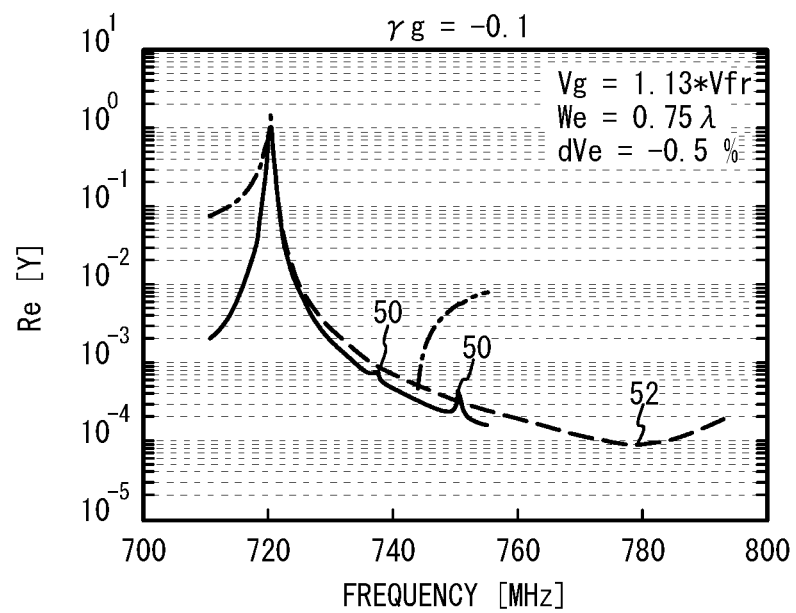

FIG. 20A and FIG. 20B are graphs of conductance versus frequency simulated for the acoustic wave resonator of the seventh embodiment. The simulation conditions in FIG. 20A and FIG. 20B are as follows.

Length of the edge region 15b: 0.75λ
FIG. 20A
   Anisotropy coefficient γg in the gap region 17: 0.0
   Acoustic velocity in the gap region 17: 1.06×Vfr
FIG. 20B
   Anisotropy coefficient γg in the gap region 17: −0.1
   Acoustic velocity in the gap region 17: 1.13×Vfr In FIG. 20A, the lateral-mode spurious is hardly observed. In FIG. 20B, a small amount of the lateral-mode spurious 50 is observed, but the conductance Re|Y| is the same level as the base level 52 of the first comparative example even at the peak of the lateral-mode spurious 50, and therefore arises no problem in practice.

A range within which the conductance Re|Y| at the peak of the lateral-mode spurious is equal to or less than the same level as the base level 52 of the first comparative example was simulated by varying the anisotropy coefficient γg and the acoustic velocity Vg in the gap region 17. The acoustic velocity Vg in the gap region 17 is represented by Vg/Vfr by dividing the acoustic velocity Vg by the acoustic velocity Vfr at the resonant frequency of the central region 15a. Set to −0.5% was dVe.

Figure 21:
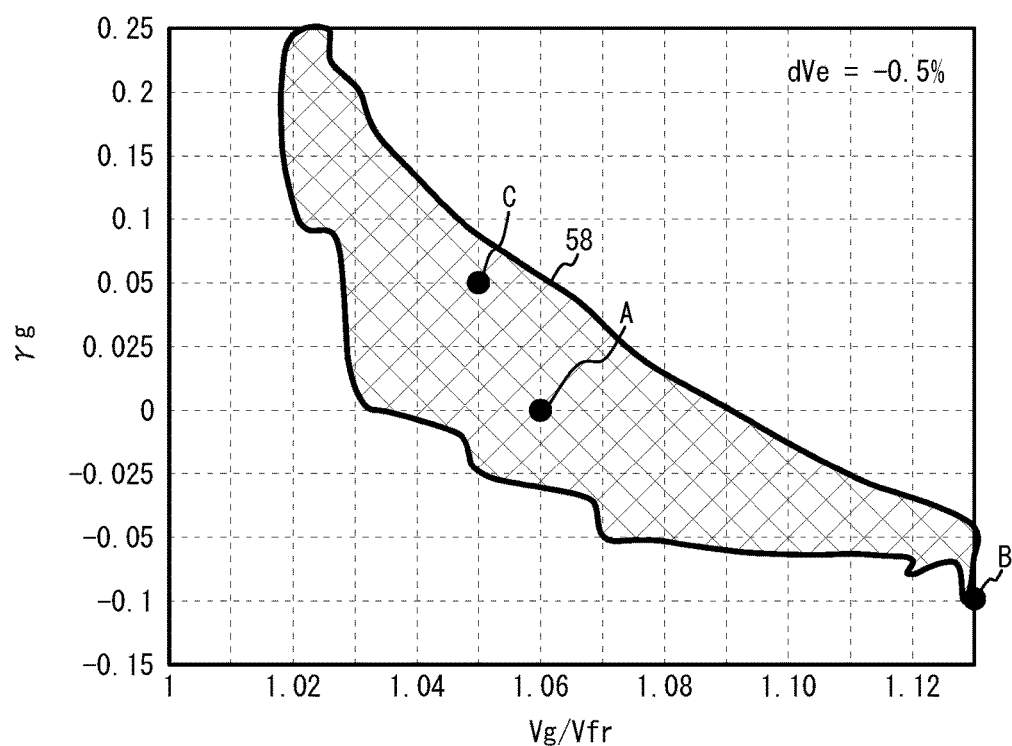
FIG. 21 illustrates a range within which the lateral-mode spurious is equal to or less than the base level of the first comparative example in the acoustic wave resonator of the seventh embodiment.

FIG. 21 illustrates a range within which the lateral-mode spurious is equal to or less than the base level of the first comparative example in the acoustic wave resonator of the seventh embodiment. A cross region 58 in FIG. 21 is a region in which the conductance at the peak of the lateral-mode spurious 50 is equal to or less than the base level 52 of the first comparative example. Black circles A and B respectively correspond to FIG. 20A and FIG. 21B. As illustrated in FIG. 21, the anisotropy coefficient γg in the gap region 17 may not be necessarily zero. In addition, there is a region where the lateral-mode spurious arises no problem in practice even when the acoustic velocity Vg in the gap region 17 is greater than the Vfa (corresponding to Vg/Vfr=1.05) at the antiresonant frequency of the overlap region 15.

Simulated was an acoustic wave resonator with −2.25% of a decrease rate dVe of the acoustic velocity in the edge region 15b. FIG. 22A through FIG. 22D are graphs of conductance versus frequency simulated for the acoustic wave resonator of the seventh embodiment. The simulation conditions in FIG. 22A through FIG. 22D are as follows.

Figure 22A:
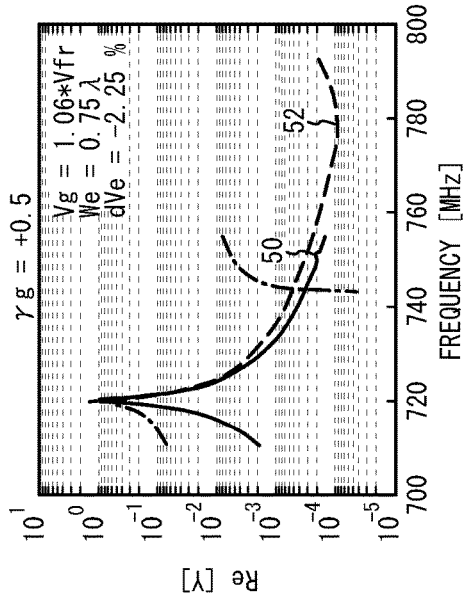
FIG. 22A through FIG. 22D are graphs of conductance versus frequency simulated for the acoustic wave resonator of the seventh embodiment.
Figure 22B:
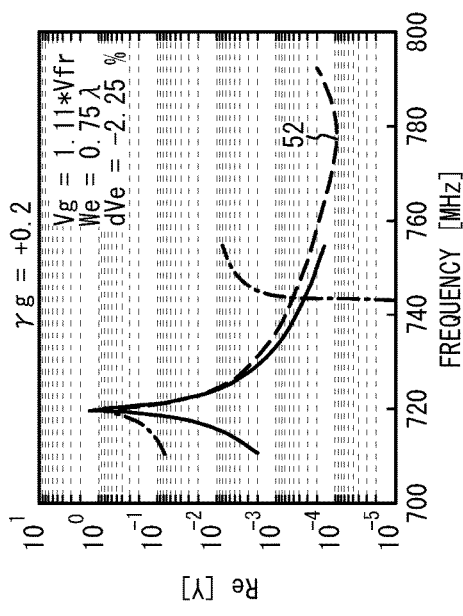
Figure 22C:
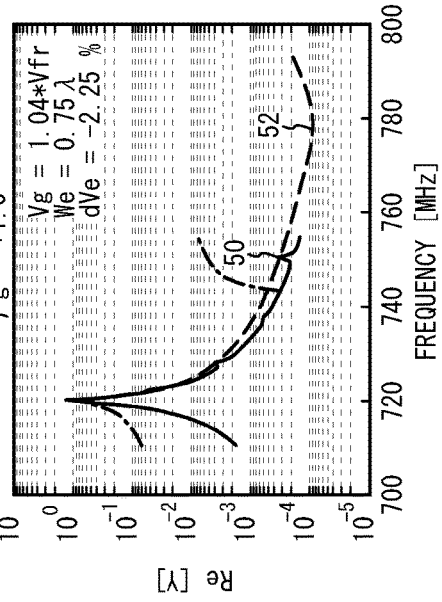
Figure 22D:
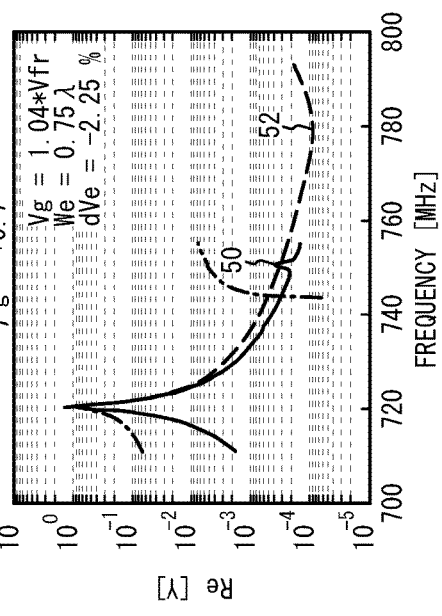

Length of the edge region 15b: 0.75λ
FIG. 22A
 Anisotropy coefficient γg in the gap region 17: +0.2
 Acoustic velocity in the gap region 17: 1.11×Vfr
FIG. 22B
 Anisotropy coefficient γg in the gap region 17: +0.5
 Acoustic velocity in the gap region 17: 1.06×Vfr
FIG. 22C
 Anisotropy coefficient γg in the gap region 17: +0.7
 Acoustic velocity in the gap region 17: 1.04×Vfr
FIG. 22D
 Anisotropy coefficient γg in the gap region 17: +1.0
 Acoustic velocity in the gap region 17: 1.04×Vfr In FIG. 22A, the lateral-mode spurious is hardly observed. In FIG. 22B, a small amount of the lateral-mode spurious 50 is observed, but the conductance Re|Y| at the peak of the lateral-mode spurious 50 is less than the base level 52 of the first comparative example. In FIG. 22C and FIG. 22D, the conductance Re|Y| at the peak of the lateral-mode spurious 50 is approximately the same as the base level 52 of the first comparative example. As described above, the level of the lateral-mode spurious in FIG. 22A through FIG. 22D arises no practical issues.

Simulated was a range in which the conductance Re|Y| at the peak of the lateral-mode spurious is equal to or less than the same level as the base level 52 of the first comparative example by varying the anisotropy coefficient γg and the acoustic velocity Vg in the gap region 17 when dVe=−2.25%.

Figure 23:
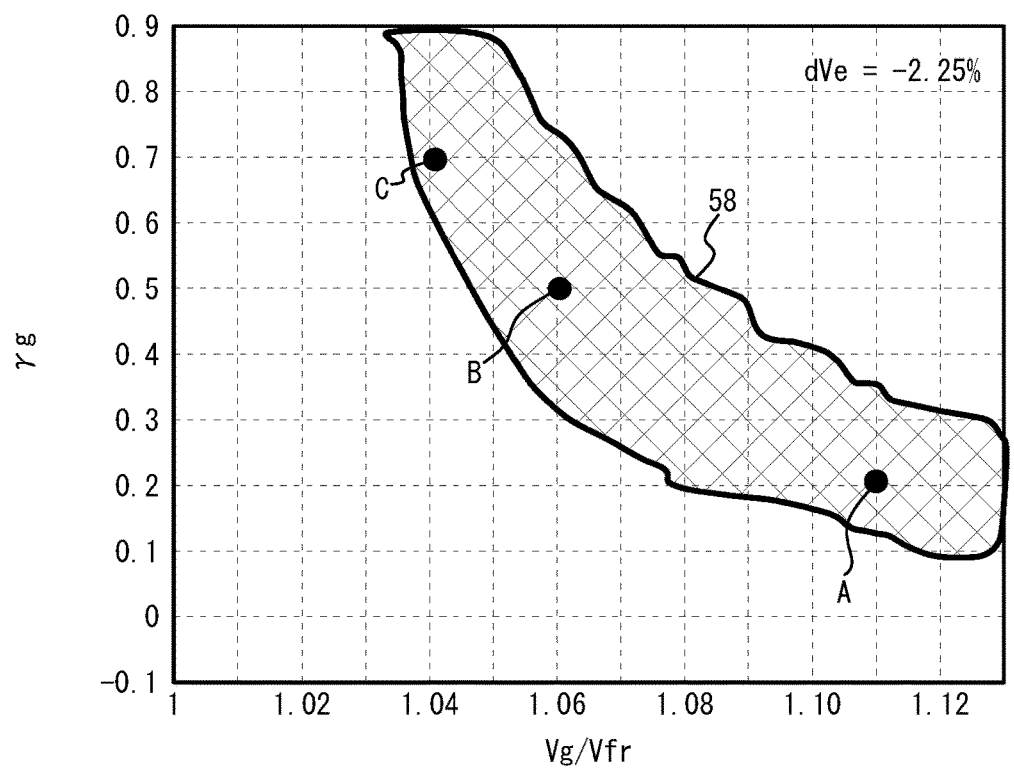
FIG. 23 illustrates a range within which the lateral-mode spurious is equal to or less than the base level of the first comparative example in the acoustic wave resonator of the seventh embodiment.

FIG. 23 illustrates a range in which the lateral-mode spurious is equal to or less than the base level of the first comparative example in the acoustic wave resonator of the seventh embodiment. Black circles A through C respectively correspond to FIG. 22A through FIG. 22C. As illustrated in FIG. 23, the anisotropy coefficient γg in the gap region 17 may be greater than zero. In addition, there is a region in which the lateral-mode spurious arises no problem in practice even when the acoustic velocity Vg in the gap region 17 is greater than the acoustic velocity Vfa at the antiresonant frequency of the overlap region 15.

As illustrated in FIG. 21 and FIG. 23, in the seventh embodiment, the degree of freedom in designing the anisotropy coefficient γg and the acoustic velocity Vg in the gap region 17 increases, and therefore the design becomes easy.

The acoustic velocity Vg in the gap region 17 is only required to be greater than the acoustic velocity Vfr at the resonant frequency of the central region 15a, but Vg/Vfr is preferably 1.02 or greater, more preferably 1.04 or greater. Vg/Vfr is preferably 1.13 or less. The acoustic velocity Vg in the gap region 17 is preferably less than the acoustic velocity Vb in the bus bar 18. This configuration can prevent the acoustic wave in the gap region 17 from leaking to the bus bar 18.

The anisotropy coefficient γg in the gap region 17 is preferably +1.0 or less, more preferably +0.5 or less.

As illustrated in FIG. 22, the decrease rate dVe of the acoustic velocity Ve in the edge region 15b is preferably −0.5% or less, more preferably −2.25% or less. That is, the acoustic velocity Ve of the acoustic wave propagating through the edge region 15b is preferably equal to or less than 0.995 of, more preferably 0.9775 of the acoustic velocity V0 of the acoustic wave propagating through the central region 15a.

Eighth Embodiment

Figure 24A:
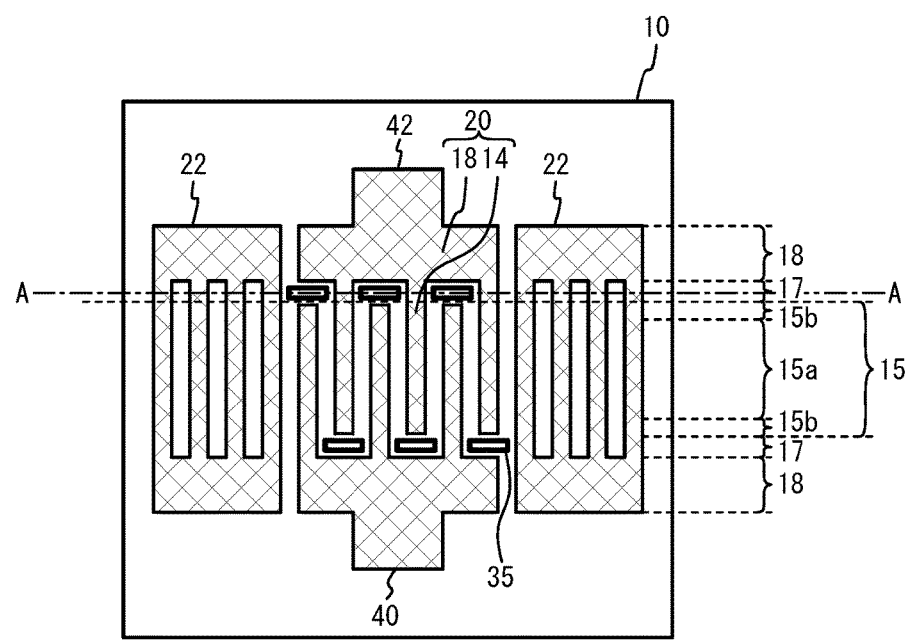
FIG. 24A is a plan view of an acoustic wave resonator in accordance with an eighth embodiment.
Figure 24B:
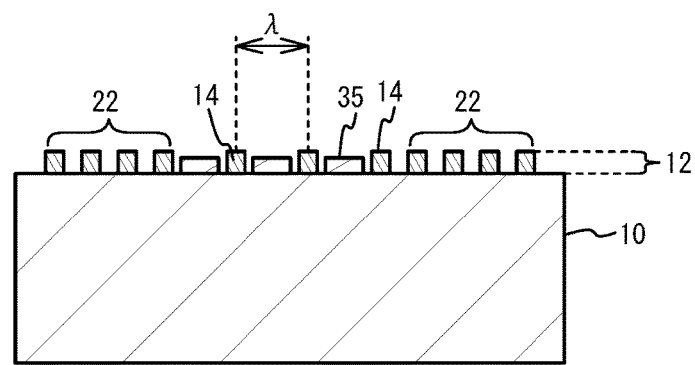
FIG. 24B is a cross-sectional view taken along line A-A in FIG. 24A and is a cross-sectional view of the gap region.

An eighth embodiment is a concrete example of the seventh embodiment. FIG. 24A is a plan view of an acoustic wave resonator in accordance with the eighth embodiment, and FIG. 24B is a cross-sectional view taken along line A-A in FIG. 24A and is a cross-sectional view of the gap region. As illustrated in FIG. 24A and FIG. 24B, in the eighth embodiment, an additional film 35 is located on the piezoelectric substrate 10 between the electrode fingers 14 in the gap region 17. Other configurations are the same as those of the fourth embodiment, and the description thereof is thus omitted.

The dispersion curve of a lateral mode SH wave in the eighth embodiment was simulated with eigenvalue analysis of a finite element method. The simulation condition is as follows.

Additional film 35: Au film with a film thickness of 0.44λ
Duty ratio in the central region 15a: 50%
Duty ratio in the edge region 15b: 54%
Other configurations used for the simulation are the same as those of the first embodiment.

Here, the anisotropy coefficient γ can be calculated from the curvature of the dispersion curve near 0 of a normalized wave number in the Y direction. The following equation is used to calculate the anisotropy coefficient γ by fitting the curvature.

$$f_N = (V_0/\kappa)\sqrt{(1+\gamma \cdot \beta_N^2 - \mu)}$$

Where $f_N$ represents a normalized frequency, $\beta_N$ represents a normalized wave number, $V_0$ represents the acoustic velocity of an acoustic wave under a free surface, and μ represents a reflection coefficient. For $V_0$, the acoustic velocity of an acoustic wave under a metal film without patterns may be used. In this case, only the value of μ, which is a correction coefficient, is appropriately changed, and γ is not affected.

Figure 25A:
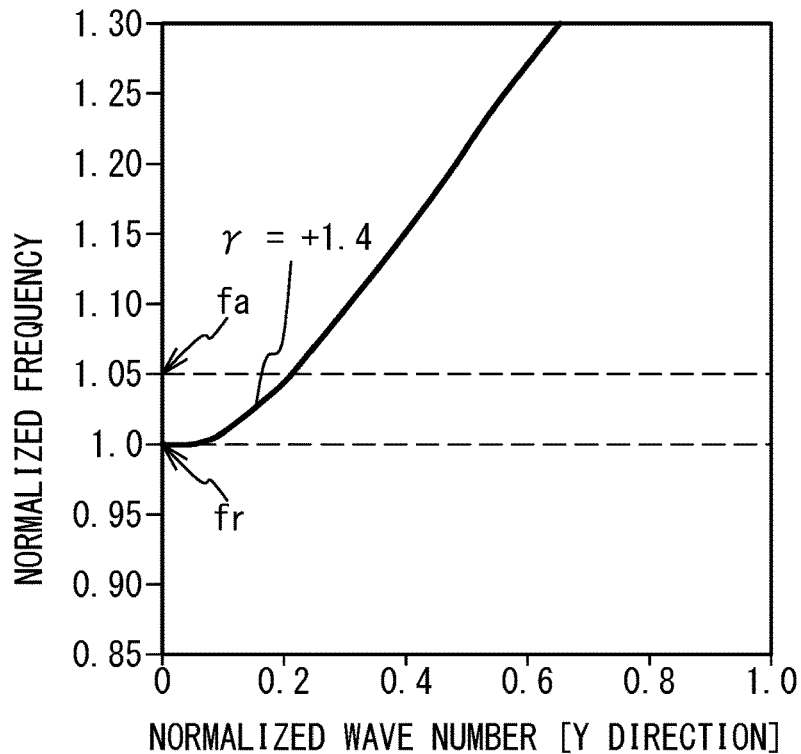
FIG. 25A and FIG. 25B illustrate dispersion curves of a central region and an edge region of the overlap region in the eighth embodiment.
Figure 25B:
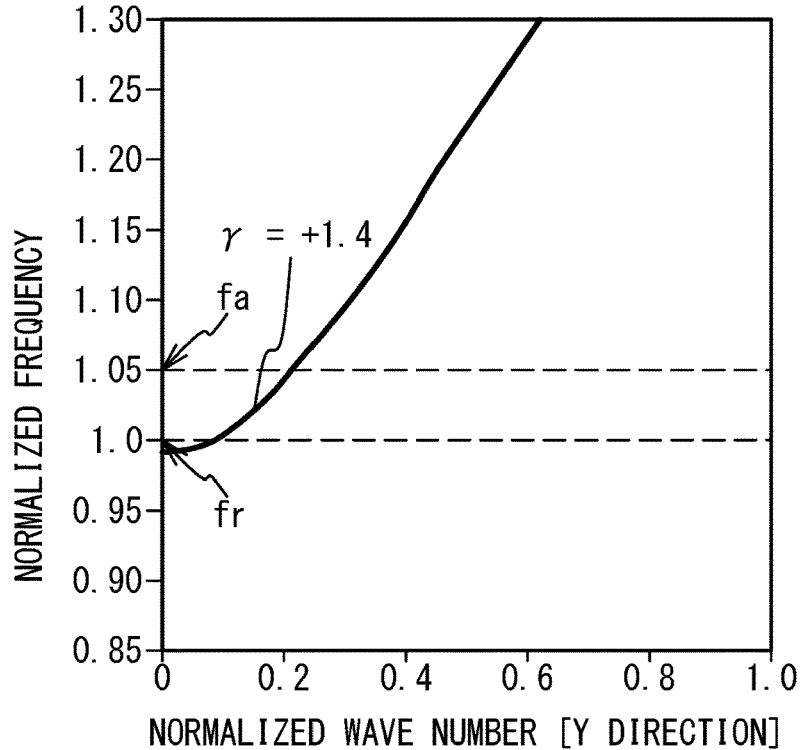

FIG. 25A and FIG. 25B illustrate the dispersion curves of the central region and the edge region in the overlap region in the eighth embodiment. As illustrated in FIG. 25A, the dispersion curve in the central region 15a is the same as that of FIG. 12 of the fourth embodiment, and γ0 is 1.4. The normalized frequency at which the normalized wave number is zero is the resonant frequency fr of the central region 15a. That is, the normalized frequency is 1.0. As illustrated in FIG. 25B, the anisotropy coefficient γg in the edge region 15b is approximately 1.4 and approximately the same as that in the central region 15a, and the normalized frequency at which the normalized wave number is zero is less than the resonant frequency by approximately 0.5%.

Figure 26:
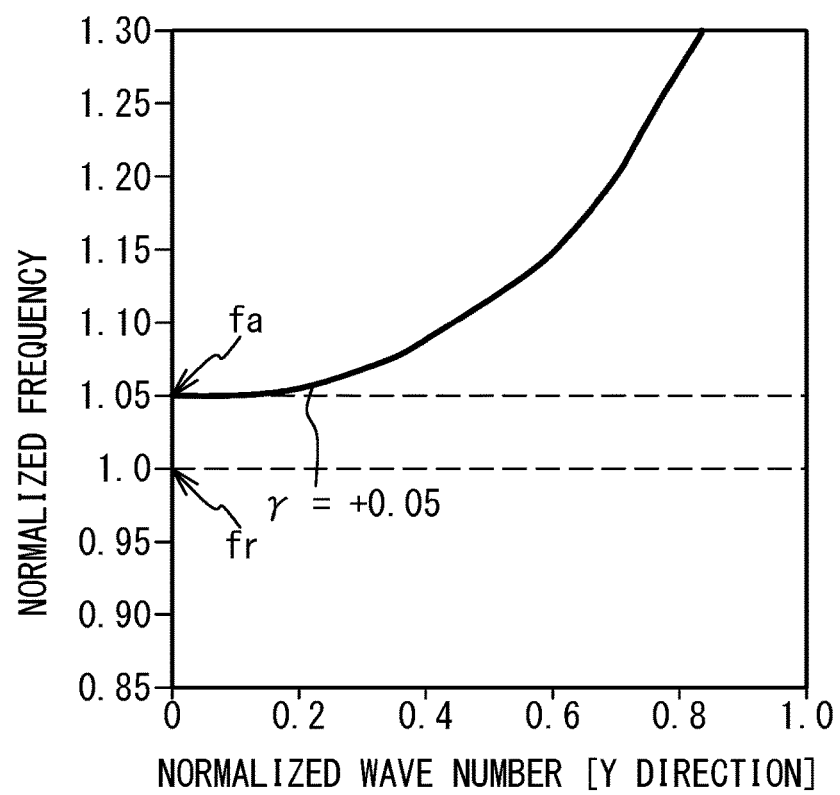
FIG. 26 illustrates the dispersion curve of the gap region in the eighth embodiment.

FIG. 26 illustrates the dispersion curve of the gap region in the eighth embodiment. As illustrated in FIG. 26, the anisotropy coefficient γg in the gap region 17 is approximately 0.05, and the normalized frequency is approximately 1.05 (i.e., Vg/Vfr=1.05).

As described above, in the eighth embodiment, dVe=−0.5%, γg=+0.05, and Vg/Vf=1.05. This corresponds to the black circle C in FIG. 21, and the lateral-mode spurious is theoretically to be reduced to approximately the base level of the first comparative example. Thus, the acoustic wave resonator of the eighth embodiment was made. The acoustic wave resonator of the first comparative example was also made.

Figure 27A:
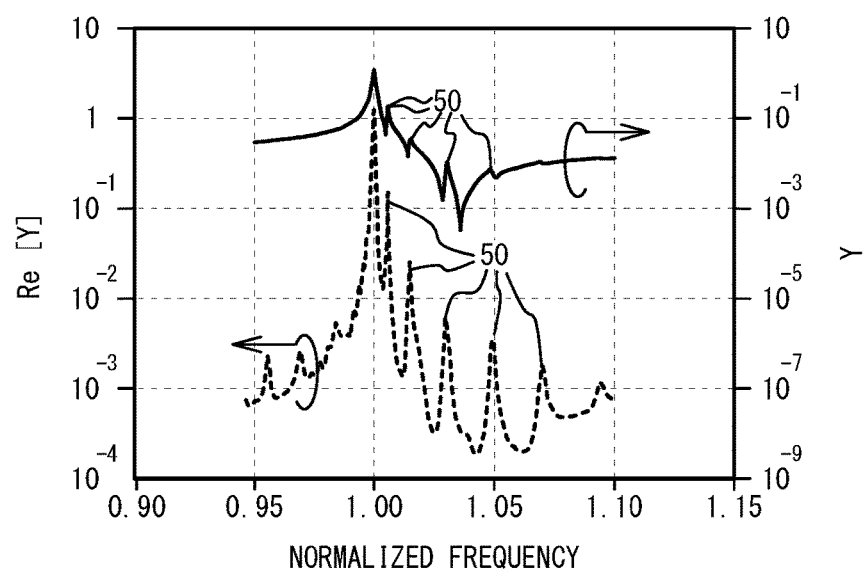
FIG. 27A and FIG. 27B illustrate measurement results of conductance and admittance with respect to frequency in the first comparative example and the eighth embodiment, respectively.
Figure 27B:
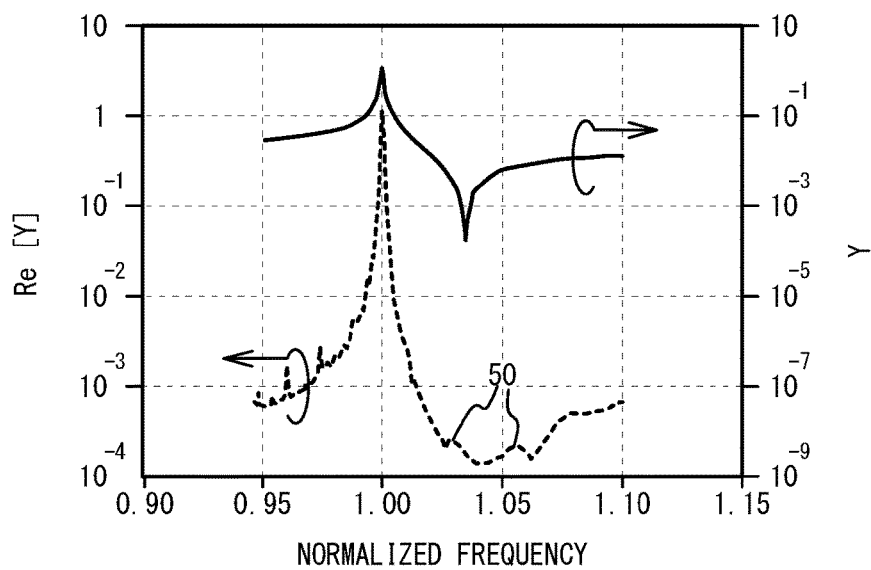

FIG. 27A and FIG. 27B illustrate measurement results of conductance Re|Y| and admittance Y with respect to frequency in the first comparative example and the eighth embodiment, respectively. As illustrated in FIG. 27A, in the first comparative example, large lateral-mode spuriouses 50 are observed. As illustrated in FIG. 27B, in the eighth embodiment, the lateral-mode spurious 50 is reduced to the level approximately equal to the base level of the first comparative example.

First Variation of Eighth Embodiment

A first variation of the eighth embodiment uses a metal film for the additional film 35. When the additional film 35 has a high density, a desired acoustic velocity can be achieved even when the additional film 35 has a small film thickness. In addition, the additional film 35 is formed after the electrode fingers 14 are formed. Thus, the additional film 35 is preferably formed by sputtering, or evaporation and liftoff. From these points, the additional film 35 is preferably formed of Au, platinum (Pt), molybdenum (Mo), ruthenium (Ru), tungsten (W), tantalum (Ta), or rhodium (Rh). The additional film 35 may be formed of a multilayered film of these metal films, an adhesion film, and/or a burrier film, or an alloy film of these metals. Alternatively, the additional film 35 may be formed of a metal material same as that of the electrode finger 14.

Figure 28A:
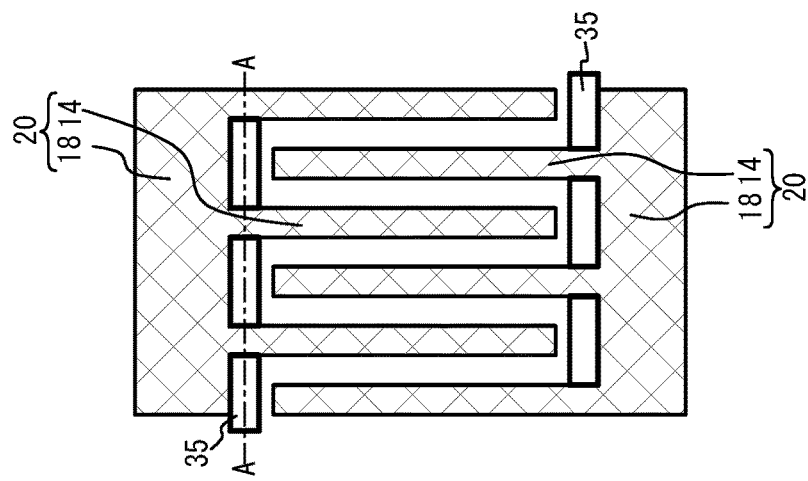
FIG. 28A through FIG. 28C are plan views of acoustic wave resonators in accordance with a first variation of the eighth embodiment.
Figure 28B:
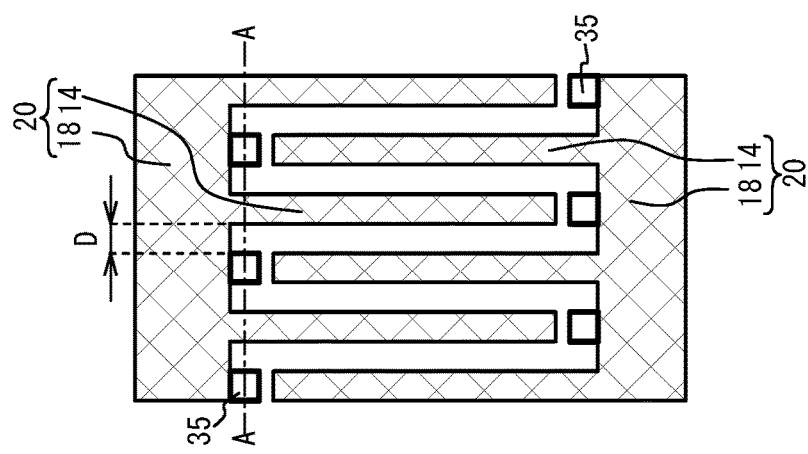
Figure 28C:
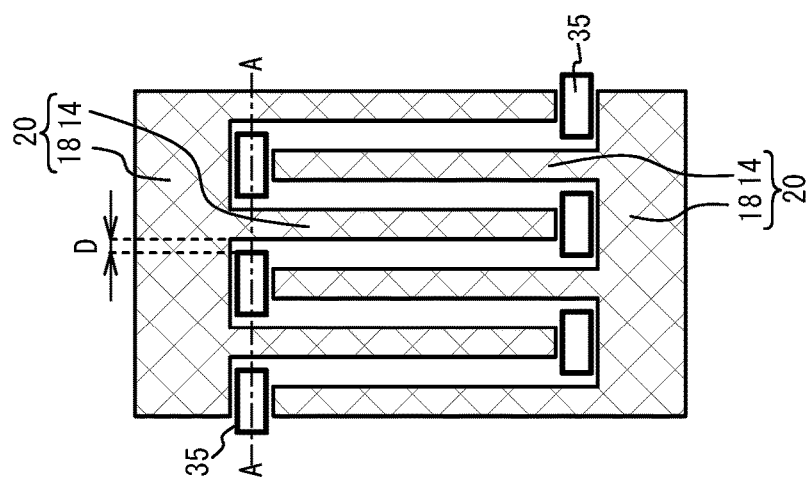

FIG. 28A through FIG. 28C are plan views of acoustic wave resonators in accordance with the first variation of the eighth embodiment. As illustrated in FIG. 28A, the additional film 35 may be located away from the electrode finger 14 and the bus bar 18. As illustrated in FIG. 28B, the additional film 35 may make contact with the bus bar 18, and may be located away from the electrode finger 14. As illustrated in FIG. 28C, the additional film 35 is only required not to make contact with the tips of the electrode fingers 14 of the opposing comb-shaped electrodes 20 even when the additional film 35 makes contact with the electrode fingers 14 and the bus bar 18.

Figure 29A:
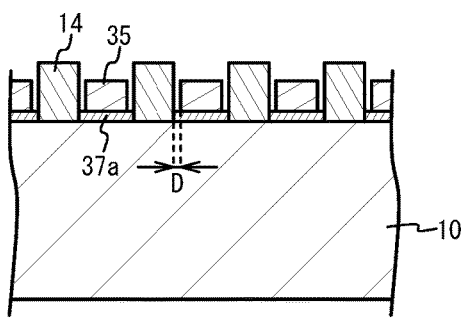
FIG. 29A through FIG. 29F are cross-sectional views taken along line A-A in FIG. 28A and FIG. 28B.
Figure 29B:
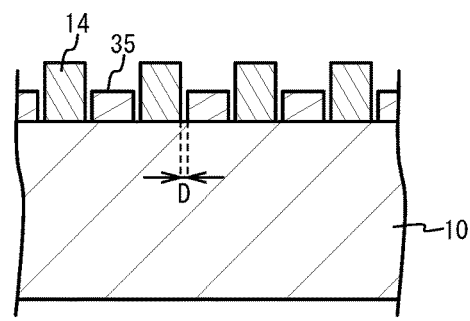
Figure 29C:
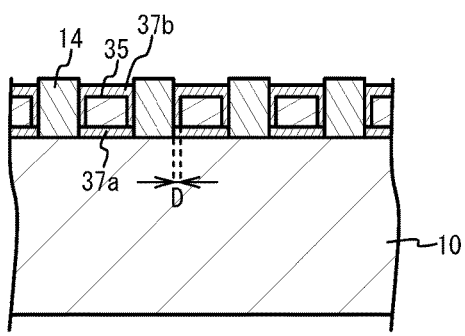

FIG. 29A through FIG. 29F are cross-sectional views taken along line A-A in FIG. 28A and FIG. 28B. The additional film 35 and the electrode finger 14 are located away from each other by distance D. FIG. 30A through FIG. 30F are cross-sectional views taken along line A-A in FIG. 28C. The additional film 35 makes contact with the electrode fingers 14. As illustrated in FIG. 29A and FIG. 30A, an insulating film 37a may be located between the additional film 35 and the piezoelectric substrate 10. As illustrated in FIG. 29B and FIG. 30B, insulating films 37a through 37c may not be necessarily located around the additional film 35. As illustrated in FIG. 29C and FIG. 30C, the insulating film 37a may be located between the additional film 35 and the piezoelectric substrate 10, and an insulating film 37b may be located on the additional film 35.

Figure 29D:
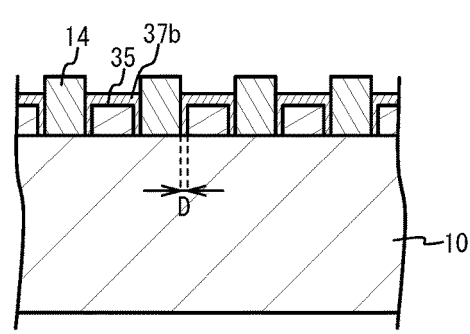
Figure 29E:
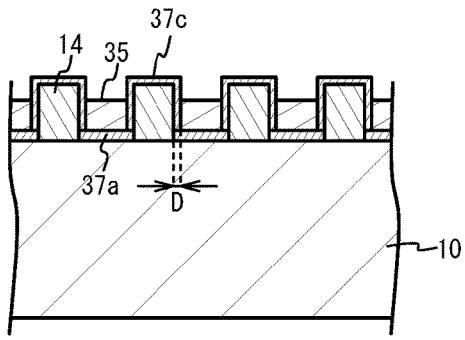
Figure 29F:
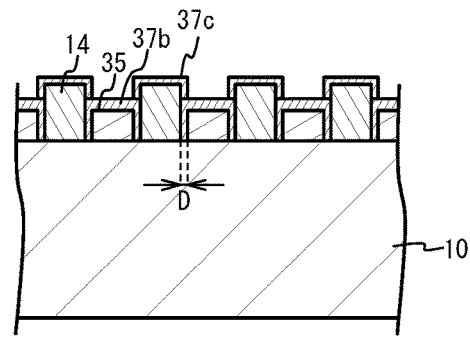
Figure 30A:
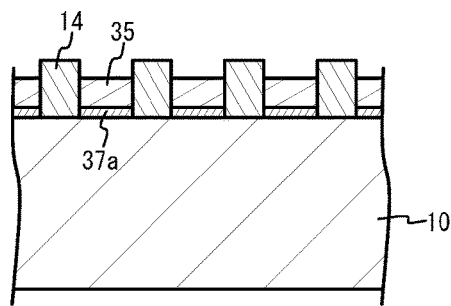
FIG. 30A through FIG. 30F are cross-sectional views taken along line A-A in FIG. 28C.
Figure 30B:
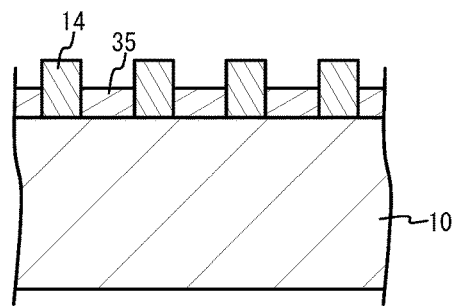
Figure 30C:
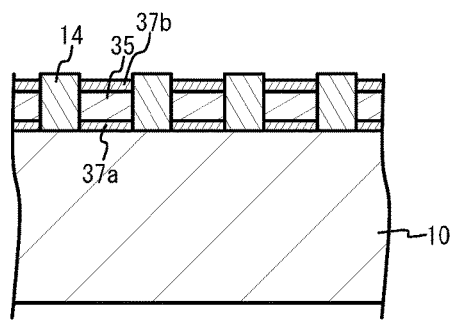
Figure 30D:
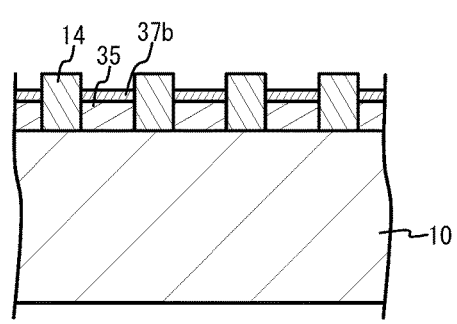
Figure 30E:
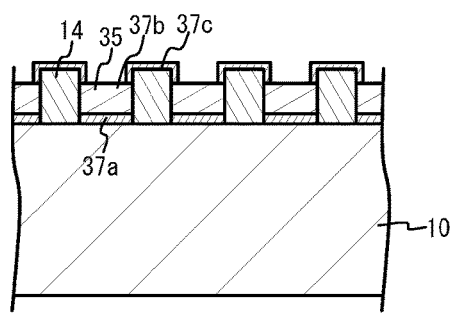
Figure 30F:
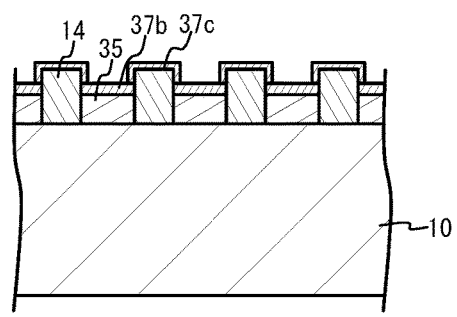

As illustrated in FIG. 29D and FIG. 30D, the insulating film 37b may be located on the additional film 35. As illustrated in FIG. 29E and FIG. 30E, the insulating film 37a may be located between the additional film 35 and the piezoelectric substrate 10, and the insulating film 37c may be located on the electrode fingers 14. As illustrated in FIG. 29F and FIG. 30F, the insulating film 37b may be located on the additional film 35, and the insulating film 37c may be located on the electrode fingers 14.

As illustrated in FIG. 29A and FIG. 29B, an insulating film may not be necessarily located between the additional film 35 and the electrode finger 14, or as illustrated in FIG. 29C through FIG. 29F, the insulating film 37b or 37c may be located between the additional film 35 and the electrode finger 14. The insulating films 37a through 37c may be formed of, for example, a silicon oxide film, a silicon nitride film, or an aluminum oxide film.

Second Variation of Eighth Embodiment

A second variation of the eighth embodiment uses an insulating film for the additional film 35. To make the additional film 35 have a high density, the additional film 35 is preferably formed of Ta oxide, Nb oxide, W oxide, or Mo oxide. The additional film 35 may be formed of a multilayered film of these insulating film or a mixed film of these oxide.

Figure 31A:
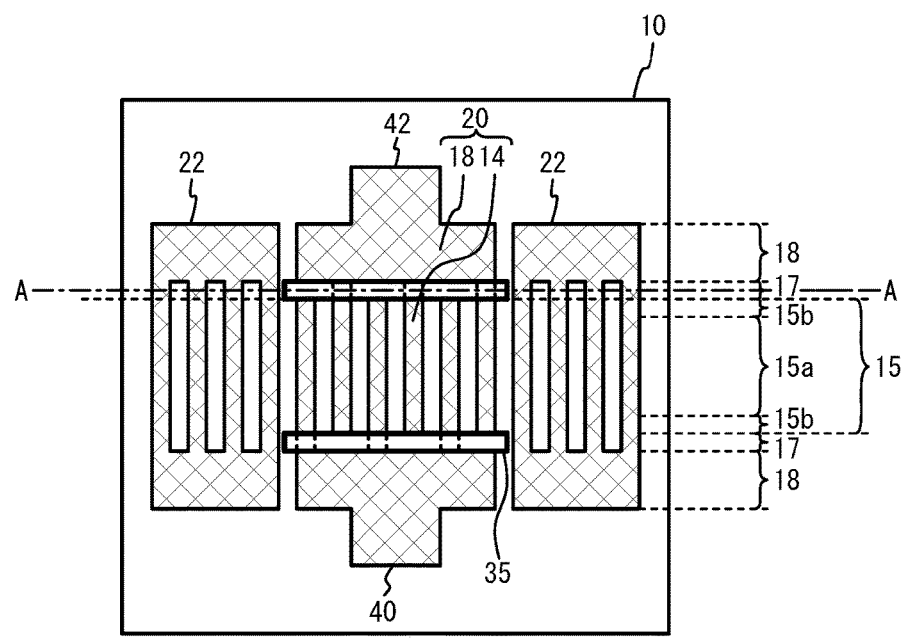
FIG. 31A is a plan view of an acoustic wave resonator in accordance with a second variation of the eighth embodiment.
Figure 31B:
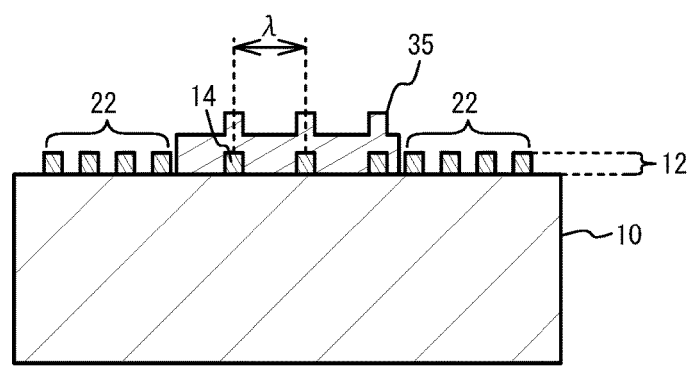
FIG. 31B is a cross-sectional view taken along line A-A in FIG. 31A and is a cross-sectional view of the gap region.

FIG. 31A is a plan view of an acoustic wave resonator in accordance with the second variation of the eighth embodiment, and FIG. 31B is a cross-sectional view taken along line A-A in FIG. 31A and is a cross-sectional view of the gap region. As illustrated in FIG. 31A and FIG. 31B, in the second variation of the eighth embodiment, the additional film 35 is located between the electrode fingers 14 and on the electrode fingers 14 in the gap region 17. Other configurations are the same as those of the eighth embodiment, and thus the description thereof is omitted.

Figure 32A:
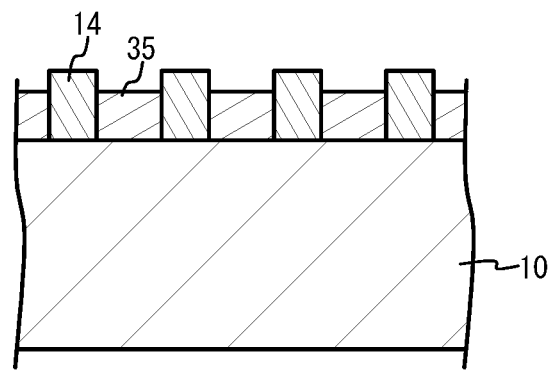
FIG. 32A through FIG. 32C are cross-sectional views of the gap region in the second variation of the eighth embodiment.
Figure 32B:
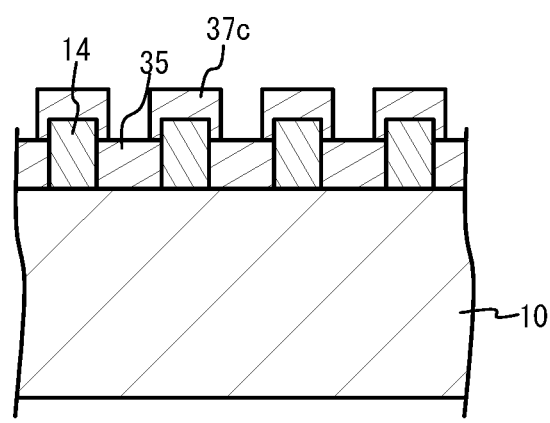
Figure 32C:
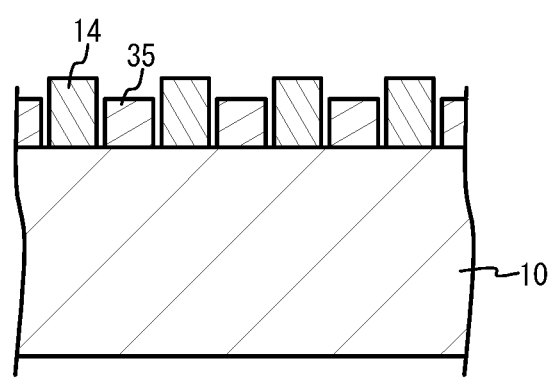

FIG. 32A through FIG. 32C are cross-sectional views of the gap region in accordance with the second variation of the eighth embodiment. As illustrated in FIG. 32A, the additional film 35 may not be necessarily located on the electrode fingers 14. As illustrated in FIG. 32B, the additional film 35 may be located between the electrode fingers 14, and another insulating film 37c may be located on the electrode fingers 14. As illustrated in FIG. 32C, the electrode finger 14 and the additional film 35 may be located away from each other.

Any one of the acoustic wave devices of the seventh and eighth embodiments and the variations thereof may be used for the filter and the duplexer of the sixth embodiment.

Although the embodiments of the present invention have been described in detail, it is to be understood that the various change, substitutions, and alterations could be made hereto without departing from the spirit and scope of the invention.

What is claimed is:
1. An acoustic wave resonator comprising:
a piezoelectric substrate; and an Interdigital Transducer (IDT) that is located on the piezoelectric substrate, and includes a pair of comb-shaped electrodes facing each other, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive;

an anisotropy coefficient in a gap region is less than the anisotropy coefficient in the overlap region, the gap region being located between a tip of the grating electrode of one of the pair of comb-shaped electrodes and the bus bar of another one of the pair of comb-shaped electrodes, and an acoustic velocity of an acoustic wave propagating through the gap region is equal to or less than an acoustic velocity of an acoustic wave propagating through the overlap region at an antiresonant frequency.

2. The acoustic wave resonator according to claim 1, wherein the acoustic velocity of the acoustic wave propagating through the gap region is equal to or greater than an acoustic velocity of the acoustic wave propagating through the overlap region at a resonant frequency.

3. The acoustic wave resonator according to claim 1, wherein $\gamma g/\gamma 0$ is equal to or greater than $-0.35$ and equal to or less than $+0.35$ where $\gamma g$ represents the anisotropy coefficient in the gap region and $\gamma 0$ represents the anisotropy coefficient in the overlap region.

4. The acoustic wave resonator according to claim 1, wherein the anisotropy coefficient in the gap region gradually decreases as a position from the overlap region becomes closer to the bus bar.

5. The acoustic wave resonator according to claim 1, further comprising:

an additional film located on the piezoelectric substrate in the gap region.

6. A filter comprising:
the acoustic wave resonator according to claim 1.

7. A duplexer comprising:
the filter according to claim 6.

8. An acoustic wave resonator comprising:
a piezoelectric substrate; and
an Interdigital Transducer (IDT) that is located on the piezoelectric substrate, and includes a pair of comb-shaped electrodes facing each other, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive;

an anisotropy coefficient in a region that is in the bus bar of one of the pair of comb-shaped electrodes and adjacent to a side, which is closer to the overlap region, of the bus bar of the one of the pair of comb-shaped electrodes is less than the anisotropy coefficient in the overlap region and an anisotropy coefficient in a gap region that is located between a tip of the grating electrode of another one of the pair of comb-shaped electrodes and the bus bar of the one of the pair of comb-shaped electrodes, and an acoustic velocity of an acoustic wave propagating through the gap region and an acoustic velocity of an acoustic wave propagating through the region that is in the bus bar of the one of the pair of comb-shaped electrodes and adjacent to the side, which is closer to the overlap region, of the bus bar of the one of the pair of comb-shaped electrodes are less than an acoustic velocity of an acoustic wave propagating through the overlap region at an antiresonant frequency.

9. The acoustic wave resonator according to claim 8, wherein the anisotropy coefficient in the gap region is less than the anisotropy coefficient in the overlap region.

10. The acoustic wave resonator according to claim 8, wherein the acoustic velocity of the acoustic wave propagating through the gap region and the acoustic velocity of the acoustic wave propagating through the region that is in the bus bar of the one of the pair of comb-shaped electrodes and adjacent to the side, which is closer to the overlap region, of the bus bar of the one of the pair of comb-shaped electrodes are equal to or greater than an acoustic velocity of an acoustic wave propagating through the overlap region at a resonant frequency.

11. The acoustic wave resonator according to claim 8, wherein an anisotropy coefficient in the gap region gradually decreases as a position from the overlap region becomes closer to the bus bar of the one of the pair of comb-shaped electrodes.

12. The acoustic wave resonator according to claim 8, further comprising:

an additional film located on the bus bar in the region that is in the bus bar of the one of the pair of comb-shaped electrodes and adjacent to the side, which is closer to the overlap region, of the bus bar of the one of the pair of comb-shaped electrodes, wherein a recessed portion is located in an upper surface of the piezoelectric substrate in the gap region.

13. A filter comprising:
the acoustic wave resonator according to claim 8.

14. A duplexer comprising:
the filter according to claim 13.

15. An acoustic wave resonator comprising:
a piezoelectric substrate; and
an Interdigital Transducer (IDT) that is located on the piezoelectric substrate, and includes a pair of comb-shaped electrodes, each of the pair of comb-shaped electrodes including a grating electrode that excites an acoustic wave and a bus bar to which the grating electrode is connected, wherein an anisotropy coefficient in an overlap region, in which the grating electrodes of the pair of comb-shaped electrodes overlap, is positive, an anisotropy coefficient in a gap region is less than the anisotropy coefficient in the overlap region, the gap region being located between a tip of the grating electrode of one of the pair of comb-shaped electrodes and the bus bar of another one of the pair of comb-shaped electrodes, an acoustic velocity of an acoustic wave propagating through the gap region is greater than an acoustic velocity of an acoustic wave propagating through a central region of the overlap region, the central region being a region other than an edge region adjacent to the gap region in the overlap region, and an acoustic velocity of an acoustic wave propagating through the edge region is less than the acoustic velocity of the acoustic wave propagating through the central region.

16. The acoustic wave resonator according to claim 15, wherein
the acoustic velocity of the acoustic wave propagating through the gap region is less than an acoustic velocity of an acoustic wave propagating through the bus bar at a resonant frequency.

17. The acoustic wave resonator according to claim 15, wherein
the acoustic velocity of the acoustic wave propagating through the edge region is equal to or less than 0.995 of the acoustic velocity of the acoustic wave propagating through the central region.

18. The acoustic wave resonator according to claim 15, further comprising
an additional film located on the piezoelectric substrate in the gap region.

19. The acoustic wave resonator according to claim 15, wherein
the piezoelectric substrate is a lithium tantalate substrate or a lithium niobate substrate.

20. A filter comprising:
the acoustic wave resonator according to claim 15.

21. A duplexer comprising:
the filter according to claim 20.

* * * * *